(12) United States Patent
Taguchi et al.

(10) Patent No.: US 12,021,104 B2
(45) Date of Patent: Jun. 25, 2024

(54) BACK SURFACE INCIDENT TYPE SEMICONDUCTOR PHOTO DETECTION ELEMENT

(71) Applicant: HAMAMATSU PHOTONICS K.K., Hamamatsu (JP)

(72) Inventors: Tomoya Taguchi, Hamamatsu (JP); Yuki Yoshida, Hamamatsu (JP); Katsumi Shibayama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 724 days.

(21) Appl. No.: 17/046,924

(22) PCT Filed: Apr. 11, 2019

(86) PCT No.: PCT/JP2019/015811
§ 371 (c)(1),
(2) Date: Oct. 12, 2020

(87) PCT Pub. No.: WO2019/203118
PCT Pub. Date: Oct. 24, 2019

(65) Prior Publication Data
US 2021/0118921 A1 Apr. 22, 2021

(30) Foreign Application Priority Data
Apr. 16, 2018 (JP) .................................. 2018-078642

(51) Int. Cl.
*H01L 27/146* (2006.01)
(52) U.S. Cl.
CPC .... *H01L 27/1464* (2013.01); *H01L 27/14649* (2013.01)
(58) Field of Classification Search
CPC ........... H01L 27/1464; H01L 27/14649; H01L 31/02363
See application file for complete search history.

(56) References Cited

U.S. PATENT DOCUMENTS

| | | | |
|---|---|---|---|
| 2004/0104351 A1* | 6/2004 | Shibayama | ....... H01L 31/02363 438/73 |
| 2008/0128846 A1 | 6/2008 | Bui et al. | |
| 2012/0313204 A1 | 12/2012 | Haddad et al. | |

FOREIGN PATENT DOCUMENTS

| | | |
|---|---|---|
| CN | 1675771 A | 9/2005 |
| CN | 1714454 A | 12/2005 |

(Continued)

OTHER PUBLICATIONS

International Preliminary Report on Patentability mailed Oct. 29, 2020 for PCT/JP2019/015811.

*Primary Examiner* — Mounir S Amer
*Assistant Examiner* — Alexander Belousov
(74) *Attorney, Agent, or Firm* — Faegre Drinker Biddle & ReathLLP

(57) ABSTRACT

A semiconductor substrate includes a first main surface and a second main surface opposing each other. The semiconductor substrate includes a first semiconductor region of a first conductivity type, and a plurality of second semiconductor regions constituting pn junctions with the first semiconductor region. The semiconductor substrate includes the plurality of second semiconductor in a side of the second main surface. Each of the plurality of second semiconductor regions includes a first region including a textured surface, and a second region including no textured surface. A thickness of the first region at a deepest position of recesses of the textured surface is smaller than a distance between a surface of the second region and the deepest position in a thickness direction of the semiconductor substrate. The first main surface is a light incident surface of the semiconductor substrate.

5 Claims, 26 Drawing Sheets

(56) References Cited

FOREIGN PATENT DOCUMENTS

| | | |
|---|---|---|
| JP | S59-061973 A | 4/1984 |
| JP | S64-011556 U | 1/1989 |
| JP | 2004-296827 A | 10/2004 |
| JP | 2009-222578 A | 10/2009 |
| JP | 2010-098329 A | 4/2010 |
| JP | 2011-023417 A | 2/2011 |
| JP | 2011-023418 A | 2/2011 |
| JP | 2012-244124 A | 12/2012 |
| JP | 2013-065911 A | 4/2013 |
| JP | 5185206 B2 | 4/2013 |
| JP | 2013-093609 A | 5/2013 |
| JP | 2016-540590 | 12/2016 |
| JP | 2017-033962 A | 2/2017 |
| WO | WO 03/096427 A1 | 11/2003 |
| WO | WO 2004/047178 A1 | 6/2004 |
| WO | WO 2015/092676 A1 | 6/2015 |
| WO | WO 2018/061898 A1 | 4/2018 |

* cited by examiner

Fig.8
(a) 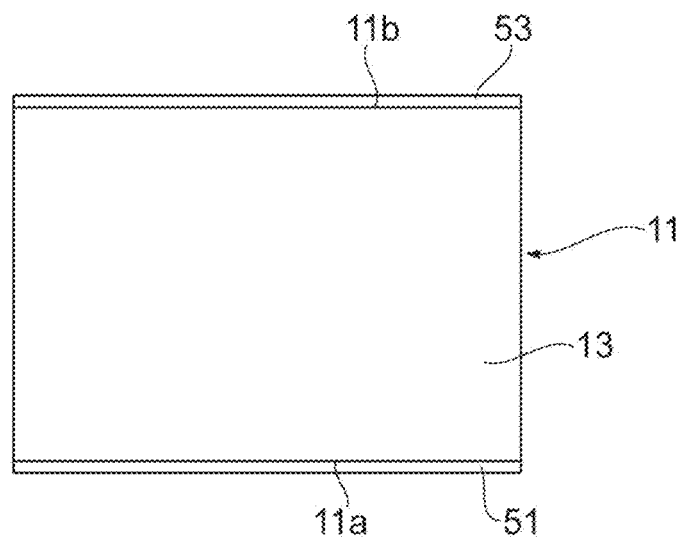
(b) 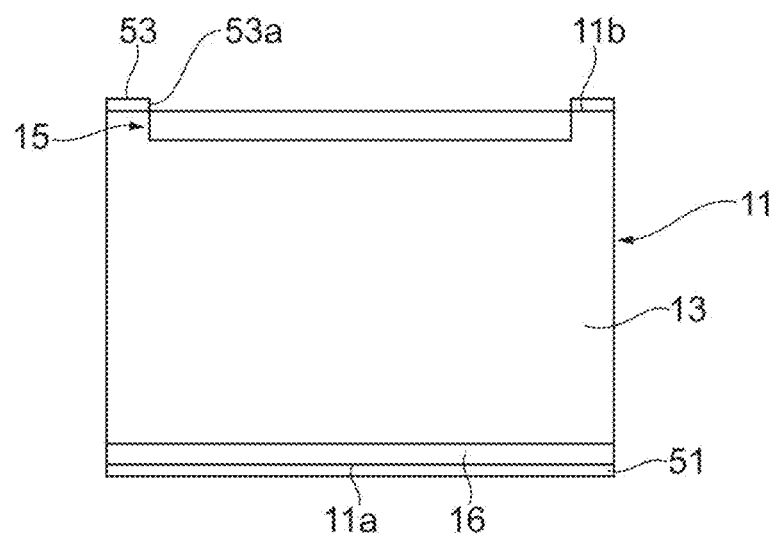
(c) 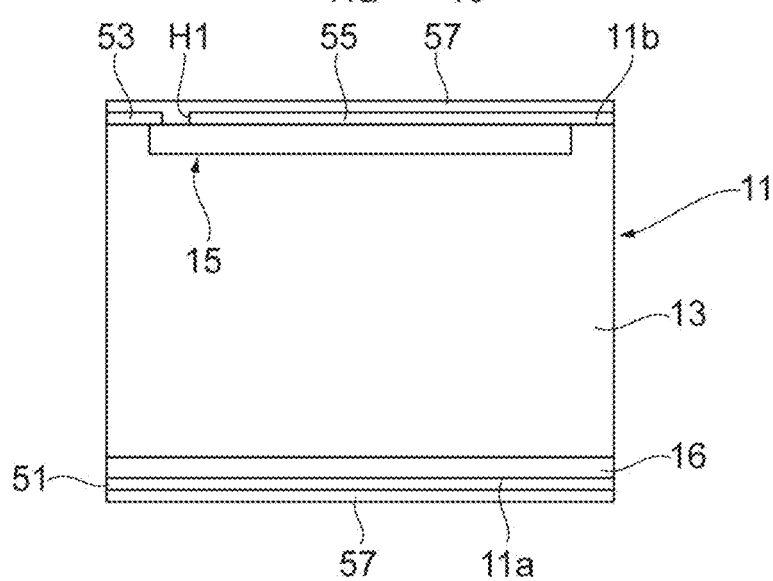

Fig.24
(a) 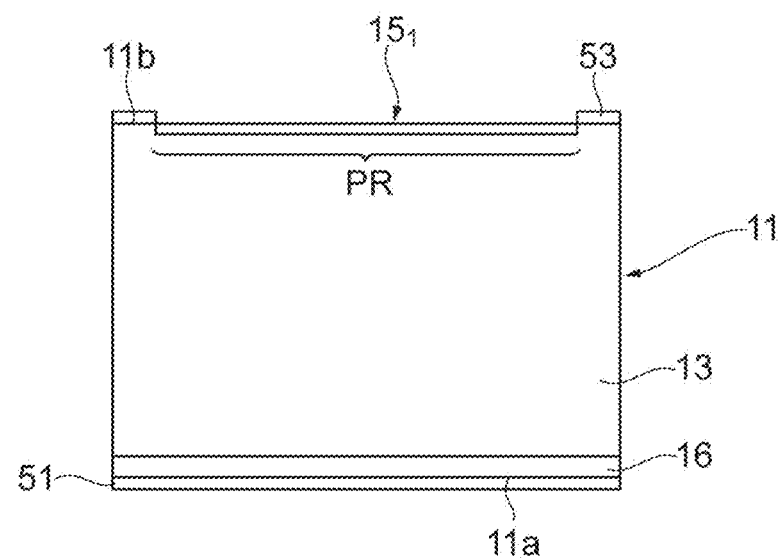
(b) 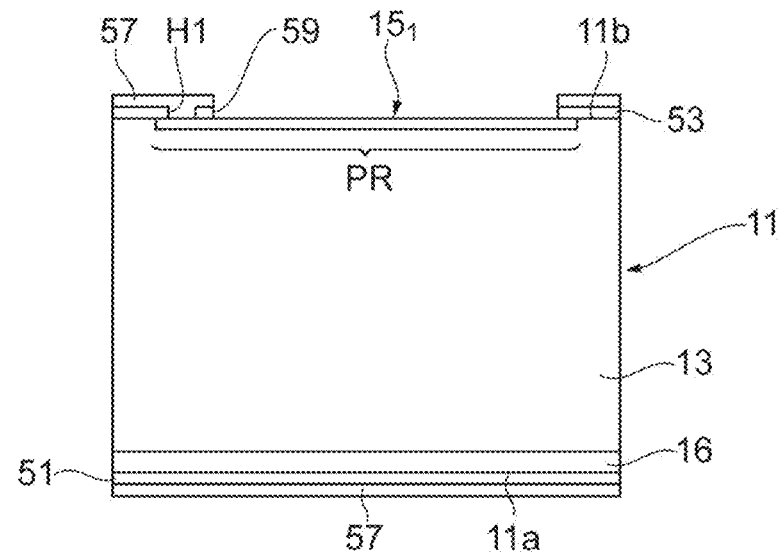
(c) 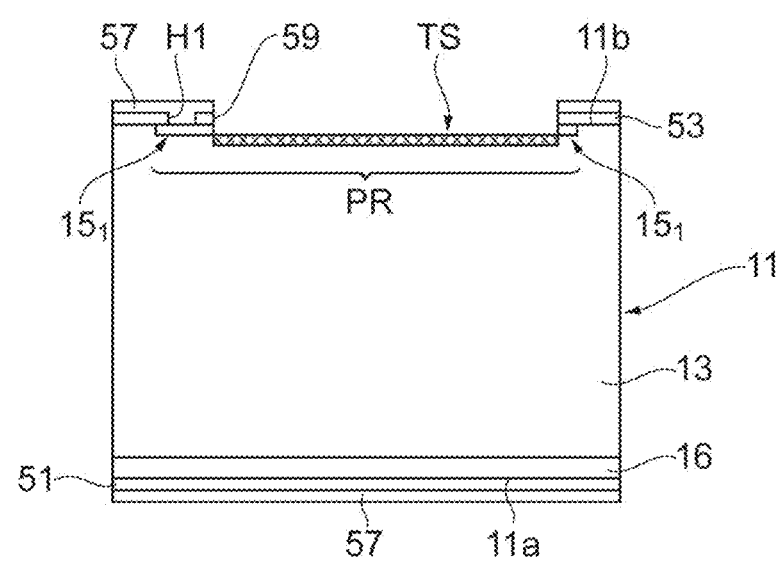

BACK SURFACE INCIDENT TYPE SEMICONDUCTOR PHOTO DETECTION ELEMENT

TECHNICAL FIELD

The present invention relates to a back-illuminated semiconductor photodetector.

BACKGROUND ART

Known back-illuminated semiconductor photodetectors that include a semiconductor substrate including a first main surface and a second main surface opposing each other (see Patent Literatures 1 and 2, for example). In a back-illuminated semiconductor photodetector described in Patent Literature 2, a semiconductor substrate includes a first semiconductor region of a first conductivity type and a plurality of second semiconductor regions of a second conductivity type. The semiconductor substrate includes the plurality of second semiconductor regions in a side of the second main surface. Each of the second semiconductor regions constitutes a pn junction with the first semiconductor region. The first main surface is a light incident surface of the semiconductor substrate. The plurality of second semiconductor regions include a textured surface.

CITATION LIST

Patent Literature

Patent Literature 1: US Patent Application Publication No. 2012/0313204
Patent Literature 2: Japanese Unexamined Patent Publication No. 2011-023417

SUMMARY OF INVENTION

Technical Problem

An object of one aspect of the present invention is to provide a back-illuminated semiconductor photodetector that further improves spectral sensitivity characteristics in a long wavelength range. For example, the long wavelength range includes a near infrared wavelength range.

Solution to Problem

A back-illuminated semiconductor photodetector according to one aspect of the present invention includes a semiconductor substrate including a first main surface and a second main surface opposing each other. The first main surface is a light incident surface of the semiconductor substrate. The semiconductor substrate includes a first semiconductor region of a first conductivity type, and a plurality of second semiconductor regions of a second conductivity type. The plurality of second semiconductor regions are provided in a side of the second main surface, and constitute pn junctions with the first semiconductor region. Each of the plurality of second semiconductor regions includes a first region including a textured surface, and a second region including no textured surface. A thickness of the first region at a deepest position of recesses of the textured surface is smaller than a distance between a surface of the second region and the deepest position in a thickness direction of the semiconductor substrate.

In the back-illuminated semiconductor photodetector according to the one aspect, the first region of the second semiconductor region includes the textured surface. Light in a long wavelength range has a small absorption coefficient as compared with light in a short wavelength range. Therefore, light in a long wavelength range that is incident on the semiconductor substrate from the first main surface travels in the semiconductor substrate and reaches the textured surface. The light having reached the textured surface is reflected or diffused at the textured surface, and further travels in the semiconductor substrate. The light in the long wavelength range travels a long distance within the semiconductor substrate, and thus is absorbed by the semiconductor substrate. Consequently, the one aspect improves spectral sensitivity characteristics in the long wavelength range.

Carriers generated due to absorption of light by the semiconductor substrate may be recombined in the second semiconductor region. Carriers recombined in the second semiconductor region do not contribute to detection sensitivity. Therefore, the spectral sensitivity characteristics may deteriorate.

Recombination of carriers in the second semiconductor region tends to occur in a configuration where a thickness of the second semiconductor region is large as compared with in a configuration where the thickness of the second semiconductor region is small That is, recombination of carriers in the second semiconductor region tends to occur in a configuration where a distance between a surface of the second semiconductor region and the pn junction is long as compared with in a configuration where the distance between the surface of the second semiconductor region and the pn junction is short.

In the one aspect, a thickness of the first region at a deepest position of recesses of the textured surface is smaller than a distance between a surface of the second region and the deepest position in a thickness direction of the semiconductor substrate.

In the one aspect, a distance between the textured surface and the pn junction is smaller than that distance in a configuration where the thickness of the first region at the deepest position of the recesses of the textured surface is equal to or larger than the distance between the surface of the second region and the deepest position in the thickness direction of the semiconductor substrate. Therefore, recombination of carriers generated by light incident on the semiconductor substrate decreases in the second semiconductor region. Consequently, the one aspect further improves the spectral sensitivity characteristics in the long wavelength range.

In the one aspect, a thickness of the second region in the thickness direction of the semiconductor substrate may be larger than a thickness of the first region in the thickness direction of the semiconductor substrate.

In a case where stress acts on the semiconductor substrate, carriers that are not attributable to incidence of light may be generated. Carriers that are not attributable to incidence of light produce dark currents. Stress tends to act on the second region as compared with on the first region. Therefore, carriers that are not attributable to incidence of light tend to be generated in the second region as compared with in the first region. In the configuration where the thickness of the second region is larger than the thickness of the first region, recombination of carriers that are not attributable to incidence of light tends to occur in the second region as compared with in a configuration where the thickness of the second region is equal to or smaller than the thickness of the first region. Therefore, this configuration reduces generation of dark currents.

The one aspect may include an electrode disposed on the second region and in contact with the second region.

In this configuration, the electrode is in contact with the second region that has a larger thickness than the thickness of the first region in the thickness direction of the semiconductor substrate.

In a case where the electrode and the semiconductor substrate are in contact with each other, a material forming the electrode and a material forming the semiconductor substrate are alloyed with each other, so that an alloy spike may be produced in the semiconductor substrate. The alloy spike having reached the pn junction increases leakage currents. In the configuration where the thickness of the second region is larger than the thickness of the first region, the alloy spike tends not to reach the pn junction as compared with in a configuration where the thickness of the second region is equal to or smaller than the thickness of the first region. Therefore, this configuration reduces an increase in leakage currents.

In the one aspect, the textured surface of the first region may be located toward the first main surface in comparison to the surface of the second region in the thickness direction of the semiconductor substrate.

In this case, stress tends not to act on the first region. Therefore, generation of carriers that are not attributable to incidence of light is reduced in the first region. Consequently, this configuration reduces generation of dark currents. According to the present configuration, the distance between the textured surface and the pn junction can be further reduced when the textured surface is formed in the second semiconductor region, for example. Therefore, the present configuration can further improve the spectral sensitivity characteristics in the long wavelength range.

In the one aspect, an edge region of the textured surface of the first region may be continuous with the surface of the second region, and may be inclined to the thickness direction of the semiconductor substrate.

In a case where the textured surface of the first region is located toward the first main surface in comparison to the surface of the second region in the thickness direction of the semiconductor substrate, stress tends to act on the second region further. In the configuration where the edge region of the textured surface of the first region is inclined to the thickness direction of the semiconductor substrate, stress acting on the second region tends to be dispersed as compared with in a configuration where the edge region of the textured surface of the first region is parallel to the thickness direction of the semiconductor substrate. Therefore, even in a case where stress acts on the second region, concentration of the stress on the second region decreases. This configuration reduces generation of carriers that are not attributable to incidence of light. Consequently, this configuration reduces generation of dark currents.

Advantageous Effects of Invention

One aspect of the present invention provides a back-illuminated semiconductor photodetector that further improves spectral sensitivity characteristics in a long wavelength range.

BRIEF DESCRIPTION OF DRAWINGS

FIG. 8 is a schematic diagram illustrating an example of a manufacturing process of the back-illuminated semiconductor photodetector according to the present embodiment.

FIG. 24 is a schematic diagram illustrating an example of a manufacturing process of the back-illuminated semiconductor photodetector according to the seventh modification.

DESCRIPTION OF EMBODIMENT

Figure 1:
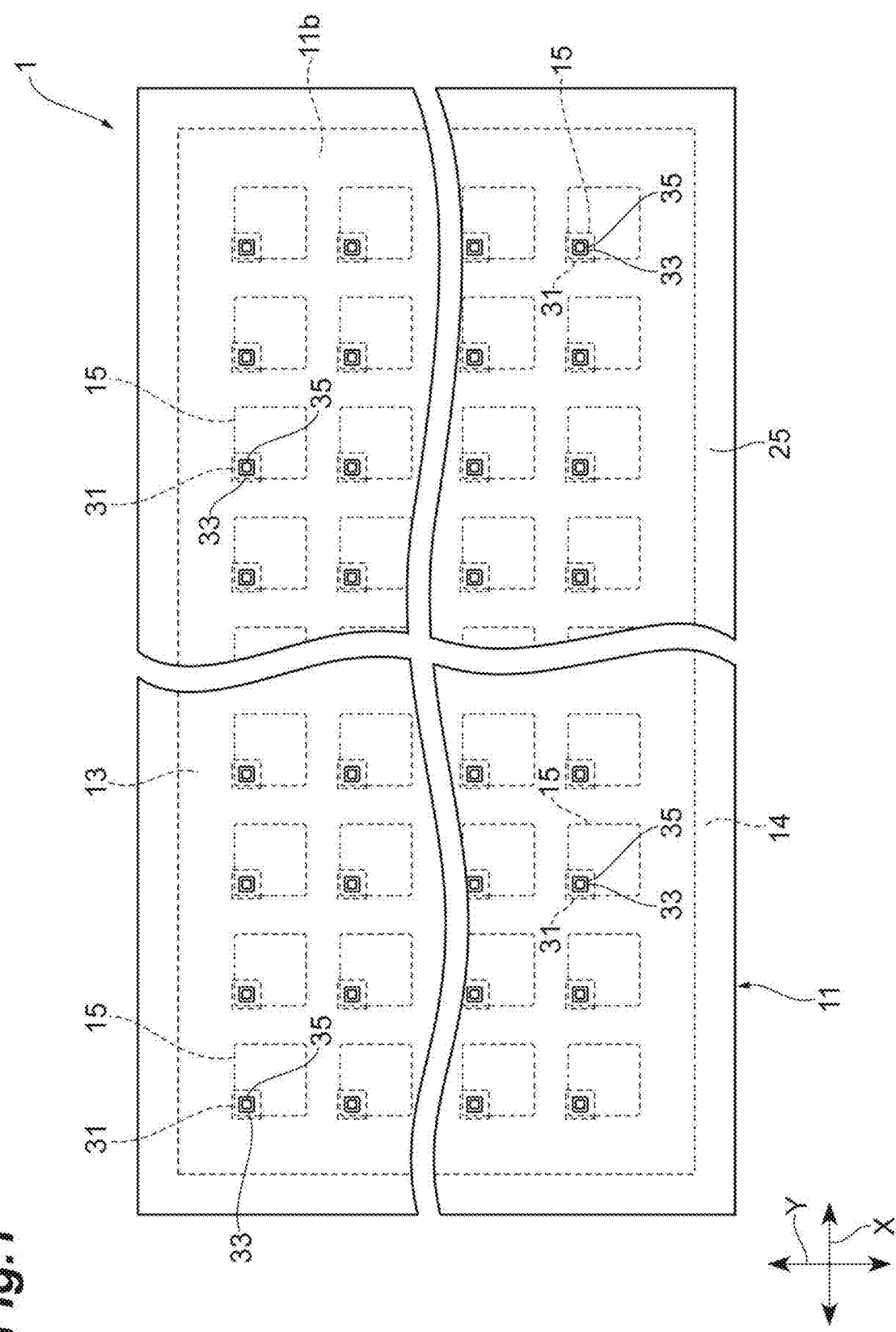
FIG. 1 is a plan view of a back-illuminated semiconductor photodetector according to an embodiment.

Embodiments of the present invention will be hereinafter described in detail with reference to the accompanying drawings. In the description, the same reference numerals are used for the same elements or elements having the same functions, and redundant descriptions thereabout are omitted.

Figure 2:
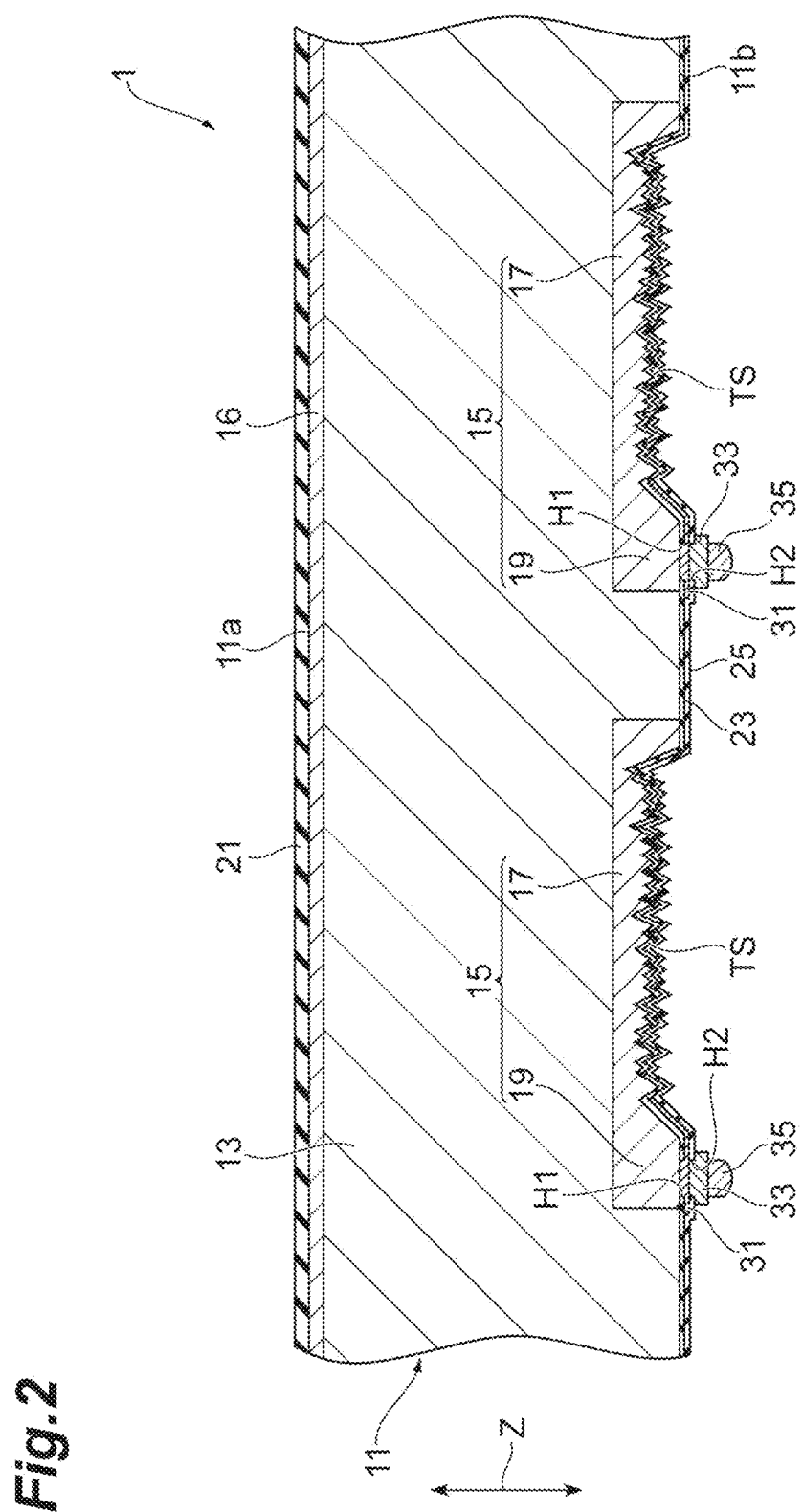
FIG. 2 is a view illustrating a cross-sectional configuration of the back-illuminated semiconductor photodetector according to the present embodiment.
Figure 3:
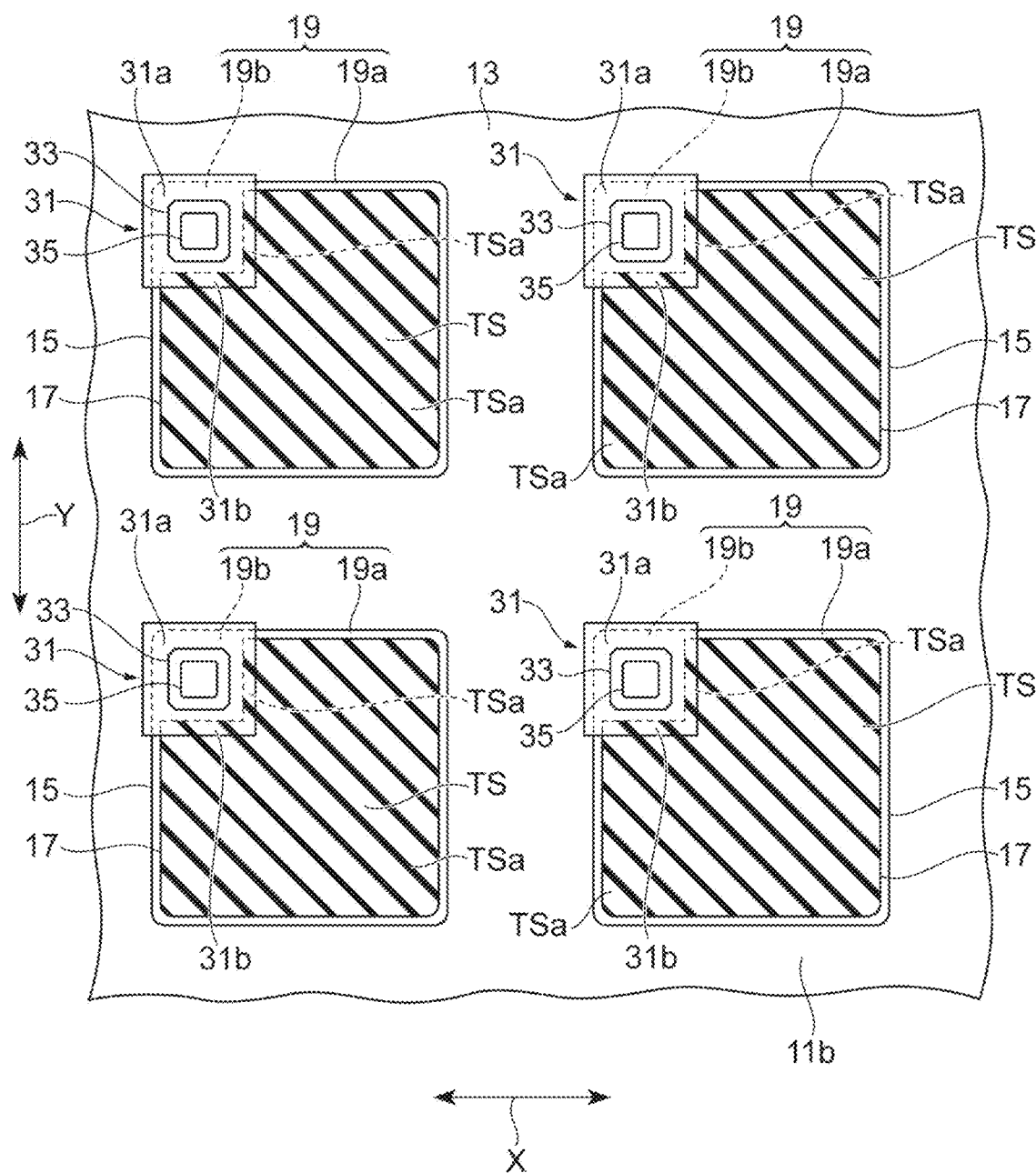
FIG. 3 is a plan view illustrating a configuration of the back-illuminated semiconductor photodetector according to the present embodiment.
Figure 4:
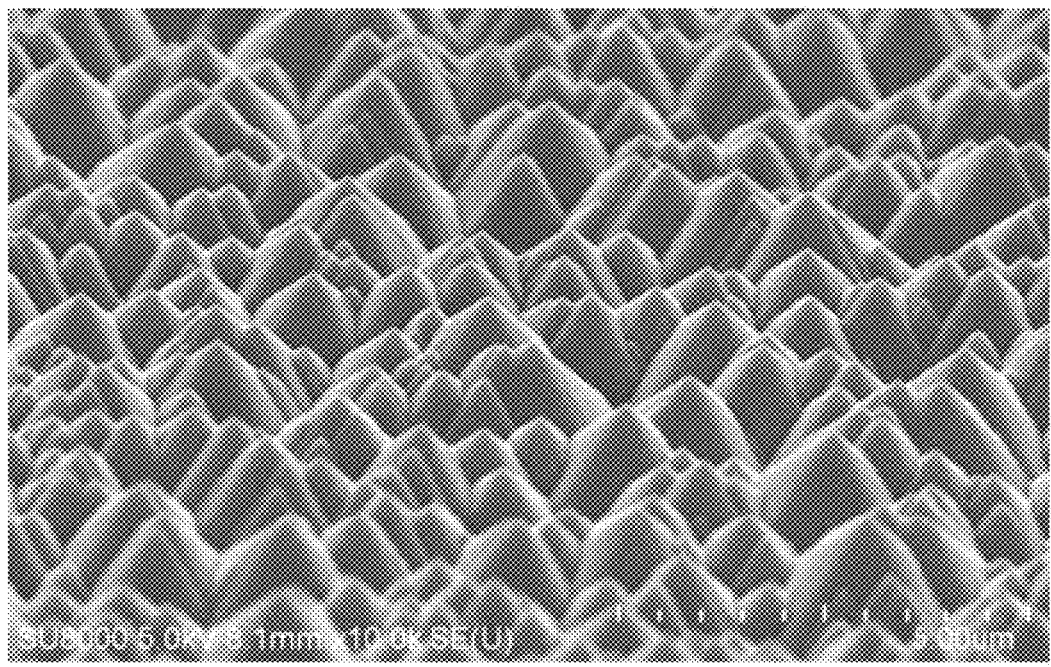
FIG. 4 is an SEM image of a textured surface observed.
Figure 5:
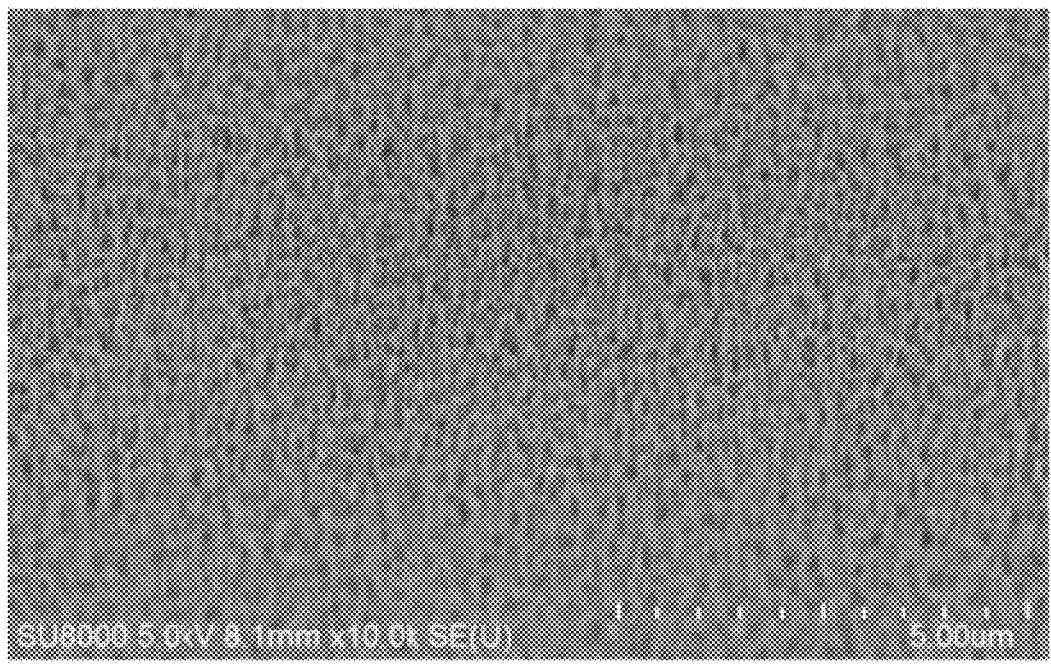
FIG. 5 is an SEM image of a textured surface observed.
Figure 6:
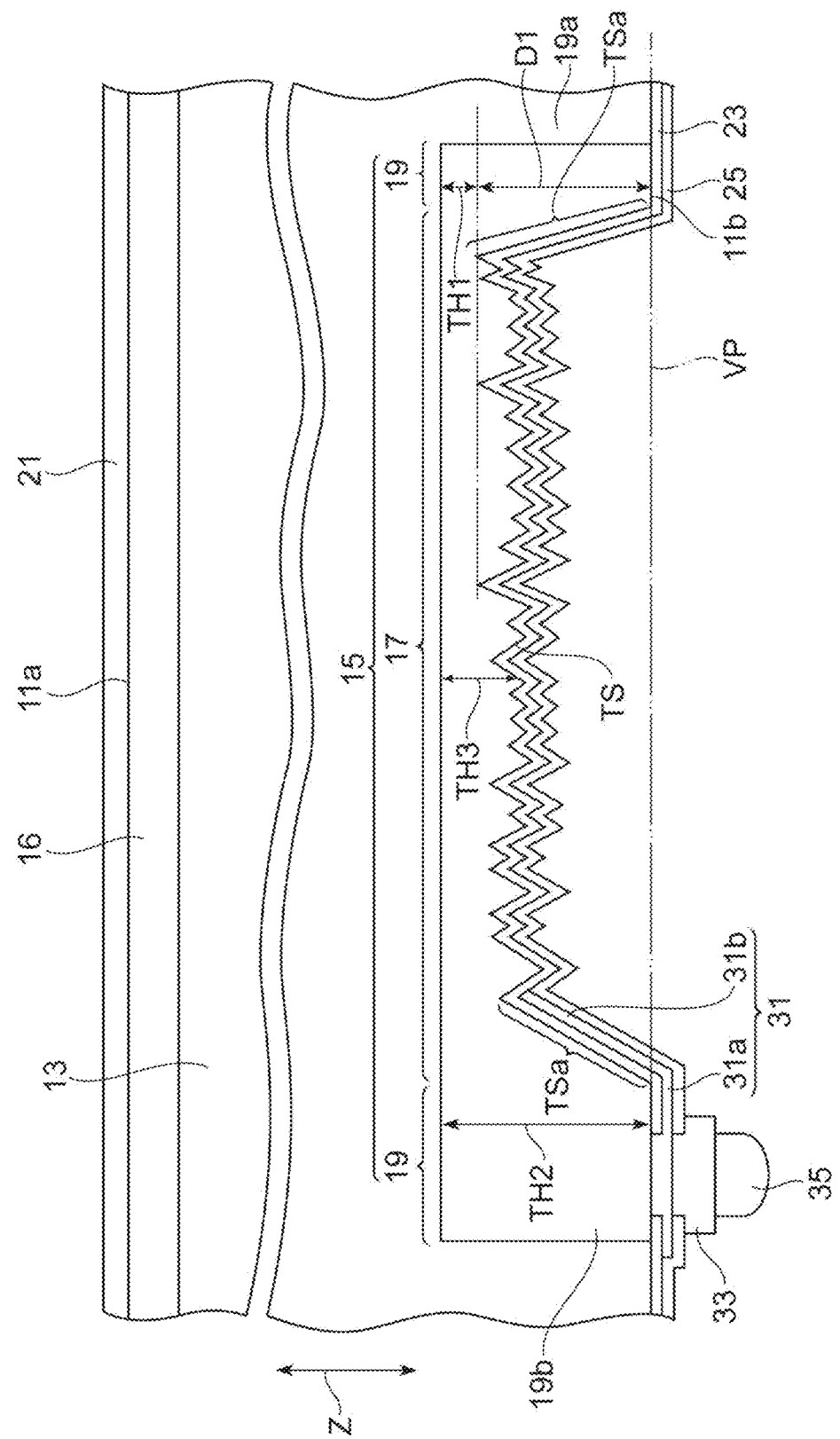
FIG. 6 is a view illustrating a cross-sectional configuration of one pixel.

A configuration of a back-illuminated semiconductor photodetector 1 according to the present embodiment will be described with reference to FIGS. 1 to 6. FIG. 1 is a plan view of the back-illuminated semiconductor photodetector according to the present embodiment. FIG. 2 is a view illustrating a cross-sectional configuration of the back-illuminated semiconductor photodetector according to the present embodiment. FIG. 3 is a plan view illustrating a configuration of the back-illuminated semiconductor photodetector according to the present embodiment. Each of FIGS. 4 and 5 is an SEM image of a textured surface observed. FIG. 6 is a view illustrating a cross-sectional configuration of one pixel. In FIG. 6, hatching for indicating a cross section is omitted.

As illustrated in FIGS. 1 and 2, the semiconductor photodetector 1 includes a semiconductor substrate 11. The semiconductor substrate 11 is a substrate made of silicon (Si). The semiconductor substrate 11 includes a main surface 11a and a main surface 11b opposing each other. The main surface 11a is a light incident surface of the semiconductor substrate 11. The main surface 11a is a back surface, and the main surface 11b is a front surface. For example, the semiconductor substrate 11 has a polygonal shape in a plan view. In the present embodiment, the semiconductor substrate 11 has a rectangular shape in the plan view. For example, the semiconductor substrate 11 has a thickness of 150 μm. For example, a thickness direction of the semiconductor substrate 11 is a direction parallel to a Z axis. In the present embodiment, the thickness direction of the semiconductor substrate 11 coincides with a direction in which the main surface 11a and the main surface 11b oppose each other. The thickness direction of the semiconductor substrate 11 coincides with a direction orthogonal to the semiconductor substrate 11, a direction orthogonal to the main surface 11a, and a direction orthogonal to the main surface 11b.

The semiconductor substrate 11 includes a semiconductor region 13 of a first conductivity type, a plurality of semiconductor regions 15 of a second conductivity type, and a semiconductor region 16 of the first conductivity type. The semiconductor substrate 11 includes the plurality of semiconductor regions 15 in a side of the main surface 11b. The semiconductor substrate 11 includes the plurality of semiconductor regions 15 provided in the side of the main surface 11b. The semiconductor substrate 11 includes the semiconductor region 16 in a side of the main surface 11a. The semiconductor substrate 11 includes the semiconductor region 16 provided in the side of the main surface 11a. The semiconductor region 16 functions as an accumulation layer. For example, the first conductivity type is n-type. For example, the second conductivity type is p-type. In a case of the semiconductor substrate 11 made of Si, p-type impurities include Group 13 elements, for example, and n-type impurities include Group 15 elements, for example. For example, the p-type impurities are boron (B). For example, the n-type impurities are nitrogen (N), phosphorus (P), or arsenic (As). The first conductivity type may be p-type, and the second conductivity type may be n-type.

The semiconductor region 13 has low impurity concentration. The semiconductor regions 15 and 16 have high impurity concentration. The semiconductor regions 15 and 16 have higher impurity concentration than that of the semiconductor region 13. For example, the impurity concentration of the semiconductor region 13 is $5 \times 10^{12}$ cm$^{-3}$. For example, the impurity concentration of the semiconductor region 15 is $1 \times 10^{19}$ cm$^{-3}$. For example, the impurity concentration of the semiconductor region 16 is $1 \times 10^{15}$ cm$^{-3}$. For example, the semiconductor region 15 has a maximum thickness of 5 μm. For example, the semiconductor region 16 has a thickness of 1 μm.

The plurality of semiconductor regions 15 are two-dimensionally distributed when viewed in a direction orthogonal to the semiconductor substrate 11. In the present embodiment, the plurality of semiconductor regions 15 are distributed in a first direction and a second direction orthogonal to each other. The plurality of semiconductor regions 15 are distributed in M rows by N columns. Each of M and N is an integer of 2 or more. For example, the first direction is a direction parallel to an X axis. For example, the second direction is a direction parallel to a Y axis. For example, each of the semiconductor region 15 has a polygonal shape when viewed in the direction orthogonal to the semiconductor substrate 11. In the present embodiment, each of the semiconductor regions 15 has a rectangular shape. Each of the semiconductor regions 15 may have a circular shape when viewed in the direction orthogonal to the semiconductor substrate 11. In the present embodiment, the one semiconductor region 15 constitutes one pixel. The semiconductor photodetector 1 includes a plurality of pixels two-dimensionally distributed. The semiconductor region 13 and each of the semiconductor regions 15 constitute a pn junction. The pn junction is formed at a boundary between the semiconductor region 13 and each of the semiconductor regions 15. In each pixel, a region including the semiconductor region 15 and the pn junction corresponds to a photosensitive region. The rectangular shape includes a shape with chamfered corners, and a shape with rounded corners.

The semiconductor substrate 11 includes a semiconductor region 14 of the first conductivity type. The semiconductor substrate 11 includes the semiconductor region 14 in the side of the main surface 11b. The semiconductor substrate 11 includes the semiconductor region 14 provided in the side of the main surface 11b. The semiconductor region 14 has a frame shape when viewed in the direction orthogonal to the main surface 11b. The semiconductor region 14 is provided along an edge of the main surface 11b in such a manner as to surround the region where the plurality of semiconductor regions 15 are distributed when viewed in the direction orthogonal to the main surface 11b. The semiconductor region 14 functions as a channel stop layer to stop a depletion layer before reaching a side surface of the semiconductor substrate 11.

Each of the semiconductor regions 15 includes a region 17 including a textured surface TS, and a region 19 not including the textured surface TS. The textured surface TS is a surface that includes fine protrusions and recesses as illustrated in FIGS. 4 and 5. The region 17 is a region where fine protrusions and recesses are formed on the surface. The entire surface of the region 17 includes fine protrusions and recesses. The entire surface of the region 17 includes the textured surface TS. For example, the textured surface TS is formed with wet etching. The textured surface TS may be formed with dry etching or laser irradiation. The region that includes a surface constituted by the textured surface TS corresponds to a textured region. The textured surface TS illustrated in FIG. 4 is formed with wet etching. The textured surface TS illustrated in FIG. 5 is formed with dry etching. In FIG. 3, the region corresponding to the textured surface TS is hatched to help easy understanding of the region constituted by the textured surface TS.

The protrusions and recesses of the textured surface TS are irregularly formed. The irregularity of the protrusions and recesses of the textured surface TS refers to at least either a state where intervals of tops of the protrusions and recesses irregularly change, or a state where height differences of the protrusions and recesses irregularly change. In the present embodiment, the intervals of the tops of the protrusions and recesses irregularly change, and also the height differences of the protrusions and recesses irregularly change. For example, an interval of the tops of the protrusions and recesses of the textured surface TS ranges from 0.1 to 1.0 µm. For example, a height difference of the protrusions and recesses of the textured surface TS ranges from 0.5 to 1.5 µm. The protrusions and recesses of the textured surface TS may be regularly formed.

As illustrated in FIG. 3, the region 17 is located inside the region 19 when viewed in the direction orthogonal to the semiconductor substrate 11. In the present embodiment, an entire edge of the region 17 is surrounded by the region 19 when viewed in the direction orthogonal to the semiconductor substrate 11. The region 19 includes a flat surface. The region 19 includes two regions 19a and 19b that are continuous with each other. The region 19a is located along the edge of the semiconductor region 15. The region 19b is located at one corner of the semiconductor region 15. The surface of the region 19a and the surface of the region 19b are located in the same plane. The region 17 has a shape produced by cutting out a rectangular portion from one corner of the rectangular shape when viewed in the direction orthogonal to the semiconductor substrate 11. As illustrated in FIG. 3, the region 17 and the region 19b are adjacent to each other in a direction crossing the first direction and the second direction when viewed in the direction orthogonal to the semiconductor substrate 11.

As illustrated in FIG. 6, a thickness TH1 of the region 17 at a deepest position of the recesses of the textured surface TS is smaller than a distance D1 between the surface of the region 19 (region 19b) and the deepest position in the thickness direction of the semiconductor substrate 11. For example, the deepest position is a deepest position of a deepest recess in all of the recesses. The deepest position may be a deepest position of any one of all of the recesses. The deepest position may be an average position of the deepest positions of all of the recesses.

Figure 7:
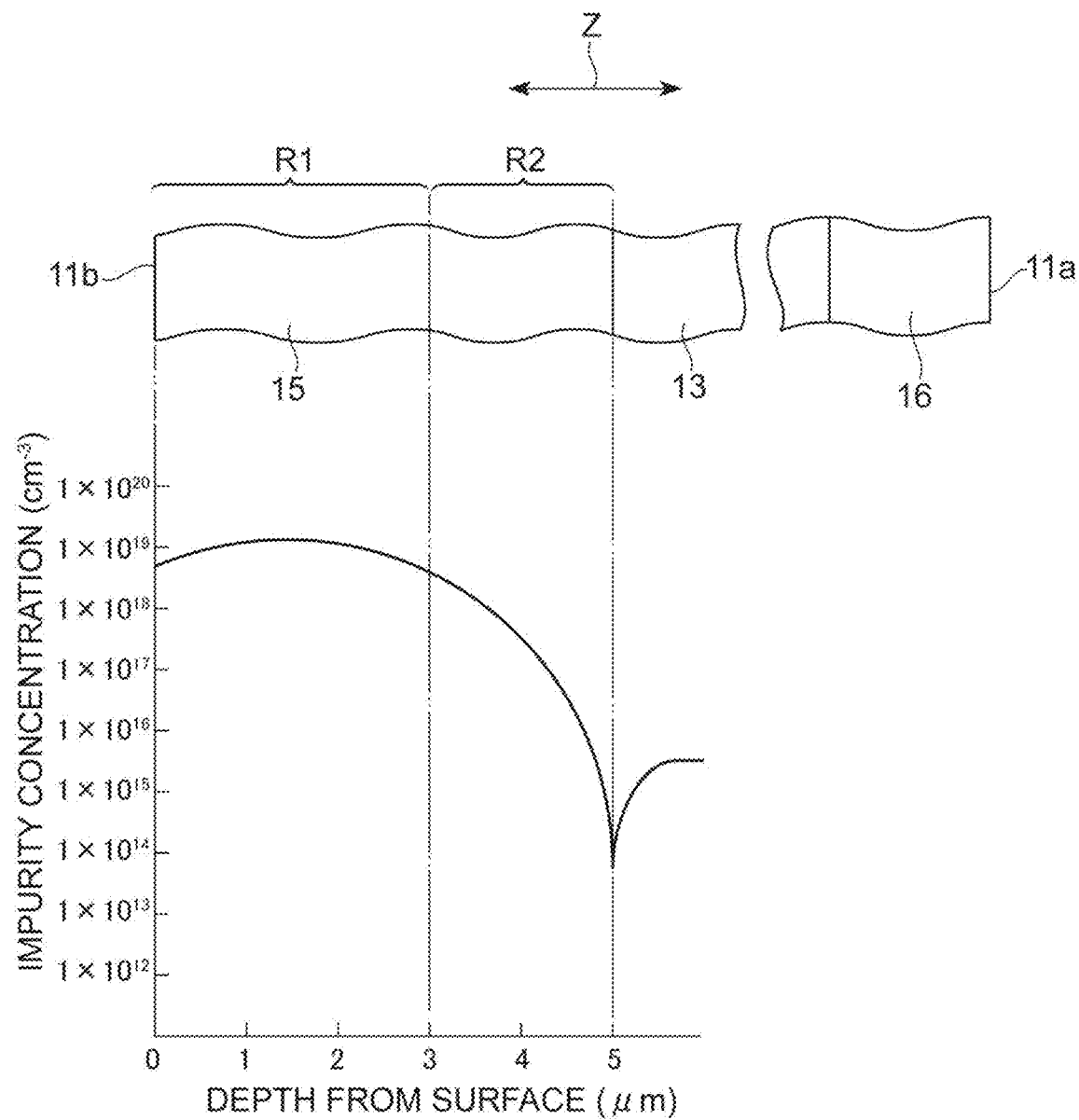
FIG. 7 is a chart illustrating a distribution of impurity concentration.

Impurity concentration of the semiconductor region 15 changes with a depth from the front surface as illustrated in FIG. 7, for example. That is, the impurity concentration of the semiconductor region 15 changes with a distance from the main surface 11b in the thickness direction of the semiconductor substrate 11, for example. FIG. 7 is a chart illustrating a distribution of the impurity concentration. The impurity concentration distribution illustrated in FIG. 7 is a distribution in a case where impurities are thermally diffused due to a following process. The semiconductor region 15 is formed, and subsequently the textured surface TS is formed. Thereafter, impurities are thermally diffused due to a high temperature heat treatment. This process will be described below as a manufacturing process of the semiconductor photodetector 1 according to the present embodiment.

The impurity concentration of the semiconductor region 15 is kept high up to a position of a predetermined depth, and gradually decreases from the position of the predetermined depth toward the main surface 11a. The semiconductor region 15 includes a region R1 that is located closer to the main surface 11b, and a region R2 that is located toward the main surface 11a in comparison to the region R1 is, on the basis of the distribution of the impurity concentration. The region R1 and the region R2 are continuous with each other. The region R1 is a high impurity concentration region. The region R2 is a transition region where the impurity concentration gradually decreases from the impurity concentration of the region R1. In the present embodiment, the predetermined depth is approximately 3 µm, for example.

In the present embodiment, the deepest position of the recesses of the textured surface TS is located near a boundary between the region R1 and the region R2. That is, the deepest position is located near a region where the impurity concentration of the semiconductor region 15 begins to decrease. In the region 17, an occupancy of the region R2 is higher than an occupancy of the region R1. The region 17 may be constituted by only the region R2.

For example, a thickness of the semiconductor region 15 (regions 17 and 19) is defined by a distance between the front surface and a depth at which the impurity concentration of the semiconductor region 15 becomes equal to the impurity concentration of the semiconductor region 16. This distance also corresponds to the distance of the semiconductor substrate 11 in the thickness direction. In this case, the thickness TH1 is defined by a distance between the deepest position of the recesses of the textured surface TS and the depth at which the impurity concentration of the semiconductor region 15 becomes equal to the impurity concentration of the semiconductor region 16. For example, the deepest position of the recesses is a deepest position of the deepest recess of all of the recesses. In this case, the thickness TH1 indicates a minimum value of the thickness of the region 17. For example, the deepest position of the recesses may be a deepest position of the shallowest recess of all of the recesses. In this case, the thickness TH1 indicates a maximum value of the thickness of the region 17. For example, the deepest position of the recesses may be an average position of the deepest positions of all the recesses. In this case, the thickness TH1 indicates an average value of the thickness of the region 17. For example, the thickness TH1 ranges from 0.1 to 1.0 µm.

For example, the thickness of the semiconductor region 15 (regions 17 and 19) may be defined by a distance between the front surface and a position where the region R2 ends in the thickness direction of the semiconductor substrate 11. As can be seen from FIG. 7, the position where the region R2 ends is a position where the decrease of the impurity concentration ends. In this case, the thickness TH1 is defined by a distance between the deepest position of the recesses of the textured surface TS and the position where the region R2 ends.

The distance D1 is a depth of the recesses of the textured surface TS. In a case where the deepest position is the deepest position of the deepest recess, the distance D1 is a maximum value of the depths of the recesses of the textured surface TS. In a case where the deepest position is the deepest position of the shallowest recess, the distance D1 is a minimum value of the depths of the recesses of the textured surface TS. In a case where the deepest position is the average position of the deepest positions of all the recesses, the distance D1 is an average depth of the recesses of the textured surface TS. For example, the distance D1 ranges from 1.0 to 2.5 μm.

A thickness TH2 of the region 19 (region 19b) in the thickness direction of the semiconductor substrate 11 is larger than a thickness TH3 of the region 17 in the thickness direction of the semiconductor substrate 11. For example, the thickness TH2 is 5 μm. In the present embodiment, the thickness TH2 is also a maximum thickness of the semiconductor region 15.

The thickness TH3 of the region 17 changes in correspondence with the protrusions and recesses of the textured surface TS. For example, the thickness TH3 is a thickness at the deepest position of the recesses of the textured surface TS. In this case, the thickness TH3 is equal to the thickness TH1. For example, the thickness TH3 may be the thickness at a top of the textured surface TS. For example, the top where the thickness TH3 is defined is a highest top of all the tops. The highest top is a top located closest to the main surface 11b in the thickness direction of the semiconductor substrate 11. In this case, the thickness TH3 indicates a maximum thickness of the region 17. For example, the top where the thickness TH3 is defined may be a lowest top of all the tops. The lowest top is a top located closest to the main surface 11a in the thickness direction of the semiconductor substrate 11. For example, the thickness TH3 may be a distance between an average height position of the protrusions and recesses of the textured surface TS and the position where the region R2 ends. For example, the thickness TH3 ranges from 0.1 to 1.5 μm.

The textured surface TS is located toward the main surface 11a in comparison to the surface of the region 19 (regions 19a and 19b) in the thickness direction of the semiconductor substrate 11. That is, the textured surface TS is located toward the main surface 11a in comparison to a virtual plane VP including the surface of the region 19 (regions 19a and 19b). The main surface 11b is recessed in the region 17. A step is formed by the textured surface TS and the surface of the region 19. An edge region TSa of the textured surface TS of the region 17 is continuous with the surface of the region 19 (regions 19a, 19b), and is inclined to the thickness direction of the semiconductor substrate 11. In the present embodiment, the edge region TSa is inclined such that the thickness of the region 17 in the edge region TSa gradually increases from the region 17 toward the region 19.

The semiconductor photodetector 1 includes a plurality of insulating films 21, 23, and 25, a plurality of pad electrodes 31, a plurality of UBMs (under-bump metals) 33, and a plurality of bump electrodes 35. In the present embodiment, the semiconductor photodetector 1 includes the one pad electrode 31, the one UBM 33, and the one bump electrode 35 for each of the semiconductor regions 15. The semiconductor photodetector 1 includes an electrode (not illustrated) electrically connected to the semiconductor region 14. The electrode electrically connected to the semiconductor region 14 is disposed on the side of the main surface 11b.

The insulating film 21 is disposed on the main surface 11a of the semiconductor substrate 11. The insulating film 21 is formed on the main surface 11a. For example, the insulating film 21 is an oxide film. In the present embodiment, the insulating film 21 is made of silicon oxide ($SiO_2$). For example, the insulating film 21 is a silicon thermal oxide film. The insulating film 21 may be made of silicon nitride (SiN). In this case, the insulating film 21 is formed with plasma CVD (Plasma-enhanced Chemical Vapor Deposition), for example. The insulating film 21 functions as an antireflective film. For example, the insulating film 21 has a thickness of 0.1 μm.

The insulating film 23 is disposed on the main surface 11b of the semiconductor substrate 11. The insulating film 23 is formed on the main surface 11b. For example, the insulating film 23 is an oxide film. In the present embodiment, the insulating film 21 is made of silicon oxide. For example, the insulating film 23 is a silicon thermal oxide film. The insulating film 23 covers the surfaces of the respective semiconductor regions 15. The insulating film 23 directly covers the entire textured surfaces TS. The insulating film 23 is in contact with the main surface 11b (textured surfaces TS). The insulating film 23 may be made of silicon nitride. In this case, the insulating film 23 is formed with low CVD (Low-pressure Chemical Vapor Deposition). The insulating film 23 may be made of aluminum oxide ($Al_2O_3$). In this case, the insulating film 23 is formed with ALD (Atomic Layer Deposition). For example, the insulating film 23 has a thickness of 0.2 μm.

The insulating film 25 is disposed on the main surface 11b of the semiconductor substrate 11. The insulating film 25 is formed on the insulating film 23. The insulating film 25 is in contact with the insulating film 23. For example, the insulating film 25 is a nitride film. In the present embodiment, the insulating film 25 is made of silicon nitride. The insulating film 23 is located between the semiconductor substrate 11 and the insulating film 25. The insulating film 25 is indirectly disposed on the semiconductor substrate 11. The insulating film 25 indirectly covers the surfaces of the respective semiconductor regions 15. The insulating film 25 directly covers a region included in the insulating film 23 and corresponding to the regions 17. The insulating film 25 indirectly covers the entire textured surfaces TS. The insulating film 25 may be made of silicon oxide. In this case, the insulating film 25 is formed with plasma CVD, for example. The insulating film 25 functions as a passivation film. For example, the insulating film 25 has a thickness ranging from 0.1 to 0.4 μm.

The pad electrode 31 is disposed on the region 19. In the present embodiment, the pad electrode 31 is disposed on the region 19b. The pad electrode 31 is formed on the region 19b and the insulating film 23. The pad electrode 31 is connected to the region 19b via a contact hole H1 formed in the insulating film 23. The pad electrode 31 is in contact with the region 19 and the insulating film 23. The pad electrode 31 is directly disposed on the region 19b. The pad electrode 31 is in contact with the insulating film 25. The insulating film 25 covers peripheral edges of the pad electrodes 31. The pad electrode 31 is made of a conductive material. For example, the pad electrode 31 is made of aluminum (Al). In this case, the pad electrode 31 is formed with sputtering or vapor deposition.

As illustrated in FIG. 3, the pad electrode 31 includes two electrode regions 31a and 31b. In the present embodiment, the pad electrode 31 is constituted by the two electrode regions 31a and 31b. The electrode region 31a is disposed on the region 19. In the present embodiment, the electrode region 31a is disposed on the region 19b. The electrode region 31a is in contact with the region 19b. The electrode region 31a is directly disposed on the region 19b. The electrode region 31b is disposed on at least a part of a region included in the insulating film 23 and corresponding to the region 17. The electrode region 31b is disposed on the region 17 such that the insulating film 23 is located between the region 17 and the electrode region 31b. The electrode region 31b is continuous with the electrode region 31a. The pad electrode 31 overlaps with an entire boundary between the region 17 and the region 19b when viewed in the direction orthogonal to the semiconductor substrate 11. In the present embodiment, the electrode region 31b overlaps with the edge region TSa that is continuous with the region 19b when viewed in the direction orthogonal to the semiconductor substrate 11. The electrode region 31b is indirectly disposed on the edge region TSa. FIG. 3 does not illustrate the insulating films 23 and 25.

The UBM 33 is disposed on the region 19. In the present embodiment, the UBM 33 is disposed on the region 19b. The UBM 33 is formed on the region 19b and the insulating film 25. The UBM 33 is connected to the pad electrode 31 via a contact hole H2 formed in the insulating film 25. The UBM 33 is in contact with the pad electrode 31. The UBM 33 is in contact with the insulating film 25. The UBM 33 is made of a material having excellent electrical and physical connection with the bump electrodes 35. For example, the UBM 33 is a laminated body constituted by a layer made of titanium (Ti) and a layer made of platinum (Pt). For example, the UBM 33 is formed with multilayer vapor deposition.

The bump electrode 35 is disposed on the region 19. In the present embodiment, the bump electrode 35 is disposed on the region 19b. The bump electrode 35 is formed on the UBM 33. The bump electrode 35 is in contact with the UBM 33. The UBM 33 is located between the pad electrode 31 and the bump electrode 35. The bump electrode 35 is indirectly disposed on the region 19. The bump electrode 35 is indirectly disposed on the pad electrode 31. The bump electrode 35 is electrically connected to the region 19b (semiconductor region 15) via the UBM 33 and the pad electrode 31. The bump electrode 35 is made of a solder material. For example, the bump electrode 35 is made of indium (In). For example, the bump electrode 35 is formed with vapor deposition.

In the semiconductor photodetector 1, the semiconductor region 13 is completely depleted due to applying a bias voltage. That is, a depletion layer extending from the semiconductor region 15 reaches the semiconductor region 13. The semiconductor region 13 need not be completely depleted.

Figure 9:
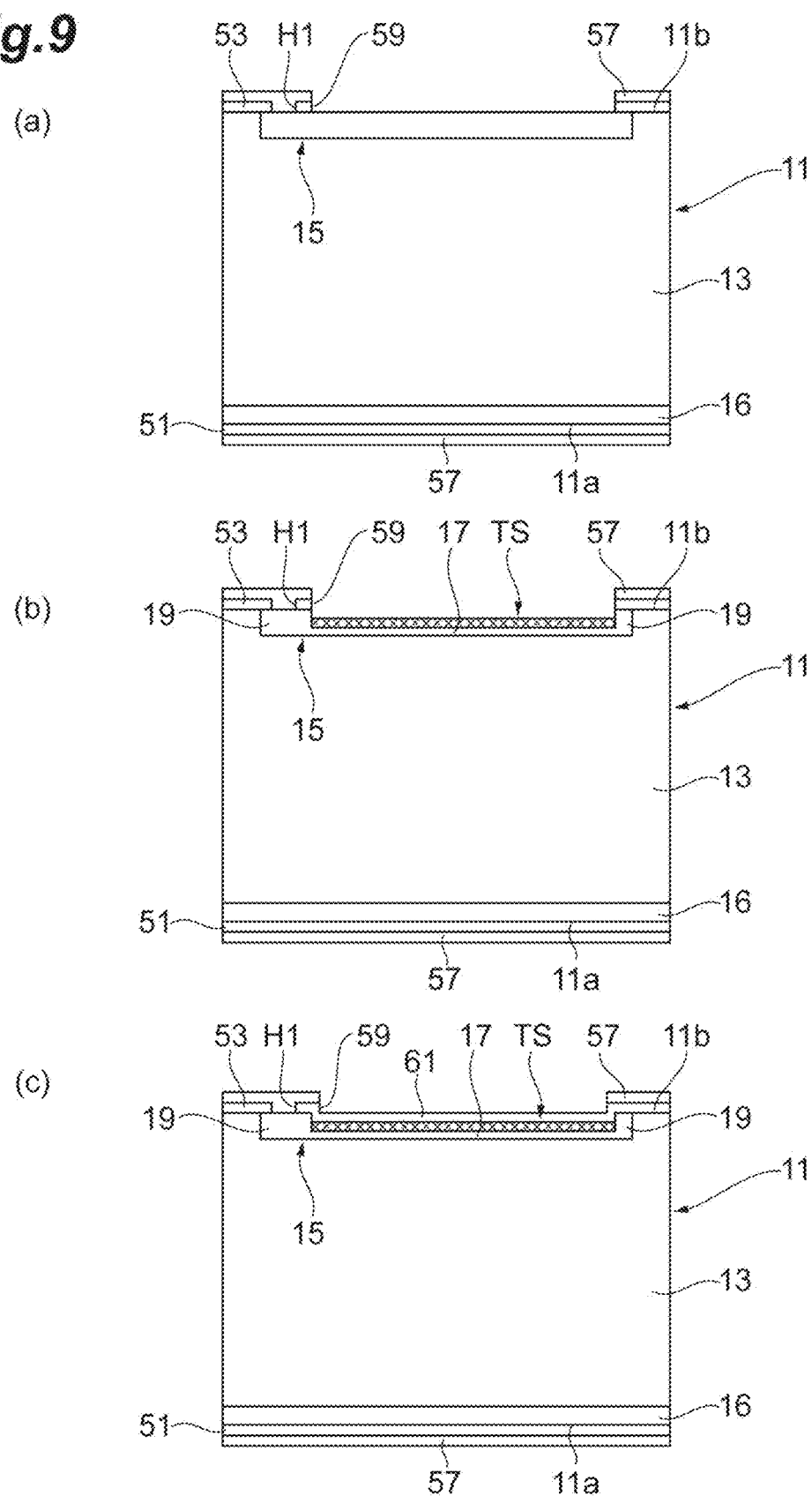
FIG. 9 is a schematic diagram illustrating an example of the manufacturing process of the back-illuminated semiconductor photodetector according to the present embodiment.
Figure 10:
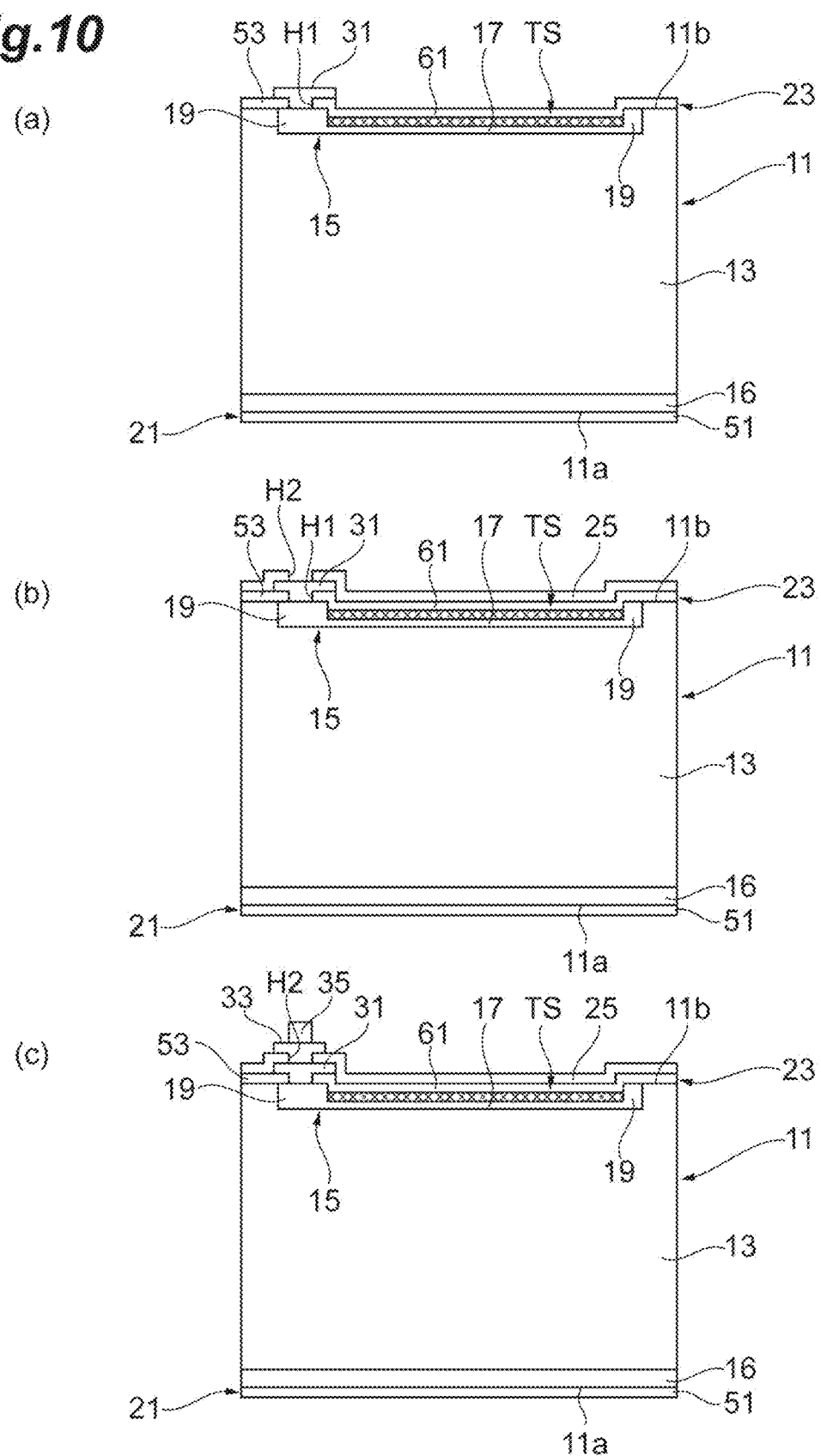
FIG. 10 is a schematic diagram illustrating an example of the manufacturing process of the back-illuminated semiconductor photodetector according to the present embodiment.

Next, an example of a manufacturing process of the semiconductor photodetector 1 will be described with reference to FIGS. 8 to 10. Each of FIGS. 8 to 10 is a schematic diagram illustrating an example of the manufacturing process of the back-illuminated semiconductor photodetector according to the present embodiment. In FIGS. 8 to 10, hatching for indicating a cross section is omitted.

As illustrated in FIG. 8(a), the n-type semiconductor substrate 11 is provided. An oxide film 51 is formed on the main surface 11a, while an oxide film 53 is formed on main surface 11b. For example, the oxide films 51 and 53 are formed due to heating the semiconductor substrate 11 in an oxygen atmosphere. In a state illustrated in FIG. 8(a), the semiconductor substrate 11 is constituted by the semiconductor region 13, and does not include the semiconductor regions 15 and the semiconductor region 16.

As illustrated in FIG. 8(b), the plurality of semiconductor regions 15 and the semiconductor region 16 are formed on the semiconductor substrate 11. By employing this process, the semiconductor substrate 11 including the semiconductor region 13, the plurality of semiconductor regions 15, and the semiconductor region 16 is provided.

The semiconductor regions 15 are formed in a following manner. Openings 53a are formed in the oxide film 53 due to patterning the oxide film 53. The openings 53a have a rectangular shape. P-type impurities are doped to the semiconductor substrate 11 from the main surface 11b via the opening 53a of the oxide film 53. The doped p-type impurities diffuse into the semiconductor substrate 11 due to a high temperature heat treatment. The semiconductor regions 15 are constituted by the high-concentration p-type impurities diffused from the main surface 11b. An oxide film 55 is formed on the semiconductor region 15 due to the above high temperature heat treatment (see FIG. 8(c)).

The semiconductor region 16 is formed in a following manner. N-type impurities are doped to the semiconductor substrate 11 from the main surface 11 a. The doped n-type impurities diffuse into the semiconductor substrate 11 due to the above high temperature heat treatment. The semiconductor region 16 is constituted by the high-concentration n-type impurities diffused from the main surface 11 a.

As illustrated in FIG. 8(c), the contact holes H1 are formed in the oxide film 55 due to patterning the oxide film 55. After the contact holes H1 are formed, a silicon nitride film 57 is formed on the oxide films 51 and 55. The silicon nitride film 57 is formed with low pressure CVD, for example.

As illustrated in FIG. 9(a), the silicon nitride film 57 formed on the oxide film 55, and the oxide film 55 are patterned, and the opening 59 is formed in the semiconductor region 15 at a position corresponding to the region 17. The opening 59 is formed with dry etching, for example.

As illustrated in FIG. 9(b), the textured surface TS is formed in a region included in the semiconductor region 15 and exposed through the opening 59. For example, the textured surface TS is formed with wet etching as described above. In FIG. 9(b) and subsequent figures, a cross-hatched region indicates a region where the textured surface TS is formed.

As illustrated in FIG. 9(c), an oxide film 61 is formed in the region included in the semiconductor region 15 and exposed through the opening 59. The oxide film 61 is formed on the textured surface TS. For example, the oxide film 61 is formed due to heating the semiconductor substrate 11 in an oxygen atmosphere. The oxide films 53 and 61 constitute the insulating film 23.

As illustrated in FIG. 10(a), the silicon nitride film 57 is removed from the upper side of the oxide film 51 and the insulating film 23 (oxide films 53 and 61). The semiconductor region 15 is exposed through the contact hole H1 due to removing the silicon nitride film 57. Thereafter, the pad electrode 31 is formed on the region included in the semiconductor region 15 and exposed through the contact hole H1. The pad electrode 31 is also formed to be located on a region included in the insulating film 23 and located around the contact hole H1. The oxide film 51 constitutes the insulating film 21.

After the insulating film 25 is formed on the insulating film 23, the contact holes H2 are formed in the insulating film 25 due to patterning the insulating film 25 as illustrated in FIG. 10(b). A part of the pad electrode 31 is exposed due to forming the contact hole H2.

As illustrated in FIG. 10(c), the UBM 33 is formed on a region included in the pad electrode 31 and exposed through the contact hole H2. The UBM 33 is also formed to be located on a region included in the insulating film 25 and located around the contact hole H2. That is, the UBM 33 is also formed to be indirectly disposed on the region 19. Thereafter, the bump electrode 35 is formed on the UBM 33. The semiconductor photodetector 1 is obtained with these processes.

Figure 11:
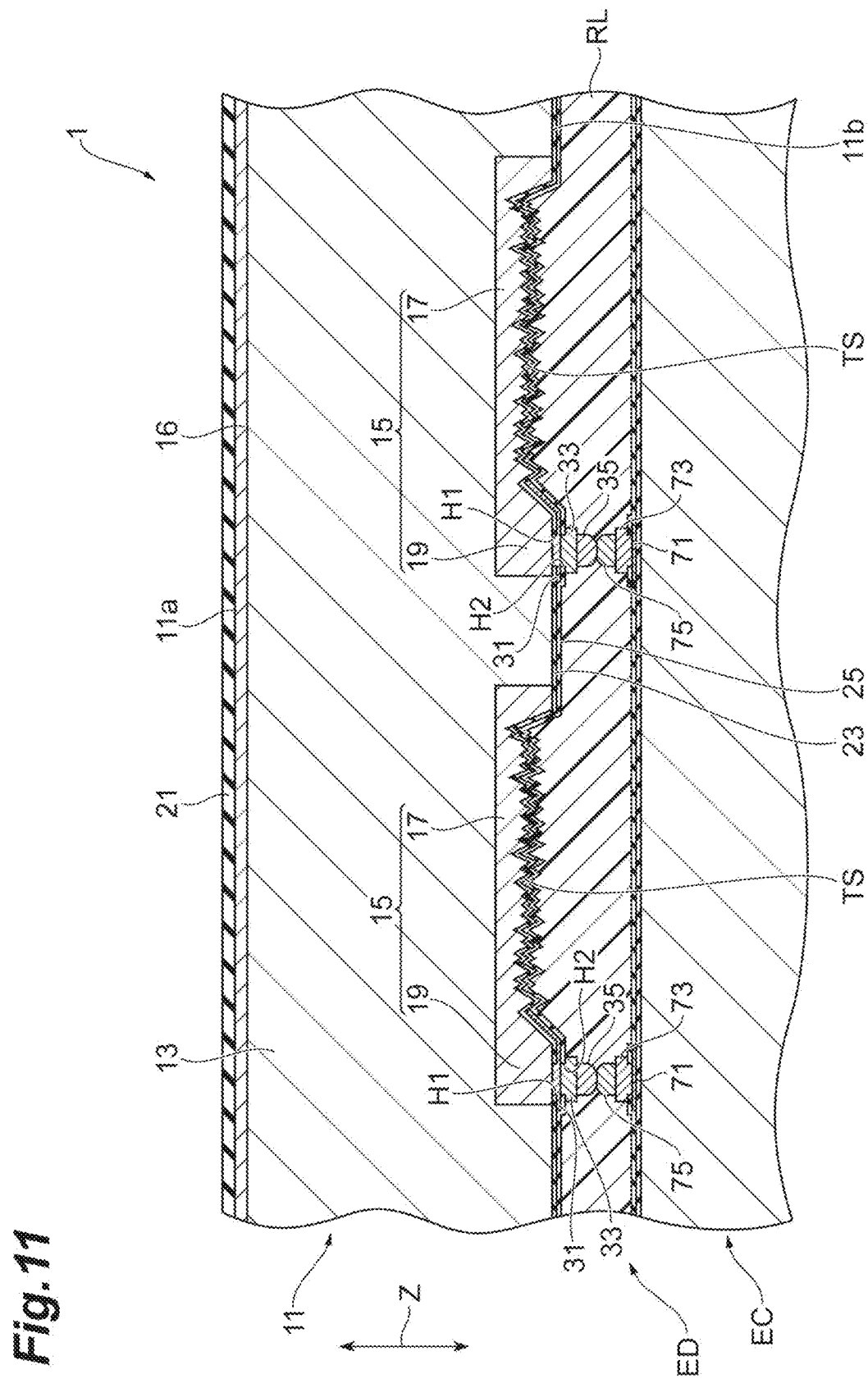
FIG. 11 is a view illustrating a cross-sectional configuration of an electronic component device that includes the back-illuminated semiconductor photodetector according to the present embodiment.

Next, a configuration of an electronic component device ED including the semiconductor photodetector 1 will be described with reference to FIG. 11. FIG. 11 is a view illustrating a cross-sectional configuration of an electronic component device that includes the back-illuminated semiconductor photodetector according to the present embodiment.

The electronic component device ED includes the semiconductor photodetector 1, an electronic component EC on which the semiconductor photodetector 1 is mounted, and a resin layer RL. For example, the electronic component EC includes a wiring board or an ASIC (Application Specific Integrated Circuit).

The electronic component EC includes a plurality of pad electrodes 71, a plurality of UBMs 73, and a plurality of bump electrodes 75. The plurality of pad electrodes 71, the plurality of UBMs 73, and the plurality of bump electrodes 75 are disposed at positions corresponding to the plurality of bump electrodes 35 included in the semiconductor photodetector 1. The semiconductor photodetector 1 is mounted on the electronic component EC due to joining the bump electrodes 35 and the bump electrodes 75 associated with each other. The electrode electrically connected to the semiconductor region 14 is also joined to a bump electrode (not illustrated) of the electronic component EC.

The resin layer RL is disposed between the semiconductor photodetector 1 and the electronic component EC. The resin layer RL functions as an underfill layer. The resin layer RL is produced due to curing a resin material filled in a space formed between the semiconductor photodetector 1 and the electronic component EC. For example, the resin layer RL contains epoxy resin, urethane resin, silicone resin, or acrylic resin.

As described above, in the semiconductor photodetector 1, the region 17 of the semiconductor region 15 includes the textured surface TS. Light in a long wavelength range has a small absorption coefficient as compared with light in a short wavelength range. Therefore, light in a long wavelength range that is incident on the semiconductor substrate 11 from the main surface 11a travels in the semiconductor substrate 11 and reaches the textured surface TS. The light having reached the textured surface TS is reflected or diffused at the textured surface TS, and further travels in the semiconductor substrate 11. The light in the long wavelength range travels a long distance within the semiconductor substrate 11, and thus is absorbed by the semiconductor substrate 11. Consequently, the semiconductor photodetector 1 improves spectral sensitivity characteristics in the long wavelength range.

Carriers generated due to absorption of light by the semiconductor substrate 11 may be recombined in the semiconductor regions 15. Carriers recombined in the semiconductor regions 15 do not contribute to detection sensitivity. Therefore, the spectral sensitivity characteristics may deteriorate. In a configuration where the semiconductor region 15 has a large thickness, recombination of carriers in the semiconductor regions 15 tends to occur as compared with in a configuration where the semiconductor region 15 has a small thickness. That is, in a configuration where a distance between the surface of the semiconductor region 15 and the pn junction is long, recombination of carriers in the semiconductor regions 15 tends to occur as compared with in a configuration where the distance between the surface of the semiconductor region 15 and the pn junction is short.

In the semiconductor photodetector 1, the thickness TH1 is smaller than the distance D1. In the semiconductor photodetector 1, the distance between the textured surface TS and the pn junction is short as compared with in a configuration where the thickness TH1 is equal to or larger than the distance D1. Therefore, recombination of carriers generated by light incident on the semiconductor substrate 11 decreases in the semiconductor regions 15. Consequently, the semiconductor photodetector 1 further improves the spectral sensitivity characteristics in the long wavelength range.

In the manufacturing process described above, the plurality of semiconductor regions 15 are formed in a plurality of planned regions before the textured regions (textured surfaces TS) are formed on the main surface 11b. In the process where the textured region is formed after forming the plurality of semiconductor regions 15, it is necessary to reliably prevent the textured region from reaching the pn junction. It is considered that increasing a thickness of each of the semiconductor regions 15 reliably prevents the textured region from reaching the pn junction. However, in a configuration including the semiconductor regions 15 each having a large thickness, improvement of the spectral sensitivity characteristics may be inhibited.

The manufacturing process of the semiconductor photodetector 1 includes the process of forming the textured regions after the plurality of semiconductor regions 15 are formed. However, in the semiconductor photodetector 1, the thickness TH1 is smaller than the distance D1. Therefore, improvement of the spectral sensitivity characteristics of the semiconductor photodetector 1 tends not to be inhibited.

In a case where stress acts on the semiconductor substrate 11, carriers that are not attributable to incidence of light may be generated. Carriers that are not attributable to incidence of light produce dark currents. Stress tends to act on the region 19 as compared with on the region 17, and therefore carriers that are not attributable to incidence of light tends to be generated in the region 19.

In the semiconductor photodetector 1, the thickness TH2 is larger than the thickness TH3. In the semiconductor photodetector 1, therefore, recombination of carriers that are not attributable to incidence of light tends to be caused in the region 19 as compared with a configuration where the thickness TH2 is equal to or smaller than the thickness TH3. Consequently, the semiconductor photodetector 1 reduces generation of the dark currents.

In the semiconductor photodetector 1, the pad electrode 31 is in contact with the region 19 (region 19b). In a case where the pad electrodes 31 and the semiconductor substrate 11 are in contact with each other, a material (Al) forming the pad electrodes 31 and a material (Si) forming the semiconductor substrate 11 are alloyed with each other, so that an alloy spike may be produced in the semiconductor substrate 11. The alloy spike having reached the pn junction increases leakage currents.

In the semiconductor photodetector 1, the thickness TH2 is larger than the thickness TH3. Therefore, in the semiconductor photodetector 1, the alloy spike tends not to reach the pn junction as compared with in a configuration where the thickness TH2 is equal to or smaller than the thickness TH3. The semiconductor photodetector 1 reduces an increase in leakage currents.

In the semiconductor photodetector 1, the textured surface TS is located toward the main surface 11a in comparison to the surface of the region 19 in the thickness direction of the semiconductor substrate 11. That is, the textured surface TS is located toward the main surface 11a in comparison to the virtual plane VP. In this case, stress tends not to act on the region 17. Therefore, generation of carriers that are not attributable to incidence of light is reduced in the region 17.

Consequently, the semiconductor photodetector 1 reduces generation of the dark currents.

In the semiconductor photodetector 1, the distance between the textured surface TS and the pn junction further decreases in a case where the textured surface TS is formed in the semiconductor region 15 as in the manufacturing process described above. Therefore, the semiconductor photodetector 1 further improves the spectral sensitivity characteristics in the long wavelength range.

The semiconductor photodetector 1 is mounted on the electronic component EC via the bump electrode 35. Therefore, stress acts on the region 19 (region 19*b*) when the semiconductor photodetector 1 is mounted on the electronic component EC. Since the textured surface TS is located toward the main surface 11*a* in comparison to the virtual plane VP, stress tends not to act on the region 17 even in a case where the semiconductor photodetector 1 is mounted on the electronic component EC. Therefore, generation of carriers that are not attributable to incidence of light is reduced in the region 17. The semiconductor photodetector 1 further reduces generation of the dark currents.

If the bump electrode 35 (or the bump electrode 75) is crushed at the time when the semiconductor photodetector 1 is mounted on the electronic component EC, the crushed bump electrode 35 (or the bump electrode 75) may physically interfere with a portion of the semiconductor photodetector 1 other than the bump electrode 35. For example, the portion other than the bump electrode 35 includes a wiring conductor or the textured surface TS. In a case where the bump electrode 35 (or the bump electrode 75) physically interferes with the wiring conductor, the bump electrode 35 (or the bump electrode 75) and the wiring conductor may be short-circuited. In a case where the bump electrode 35 (or the bump electrode 75) physically interferes with the textured surface TS, the textured surface TS may be physically damaged, so that the spectral sensitivity characteristics in the long wavelength range may be adversely affected.

In the semiconductor photodetector 1, the textured surface TS is located toward the main surface 11*a* in comparison to the virtual plane VP. The step is formed by the textured surface TS and the surface of the region 19. Therefore, the crushed bump electrode 35 (or the bump electrode 75) tends not to interfere with the portion of the semiconductor photodetector 1 other than the bump electrode 35 when the semiconductor photodetector 1 is mounted on the electronic component EC. The semiconductor photodetector 1 achieves reduction of generation of a short circuit between the bump electrodes 35 (or the bump electrodes 75) and the wiring conductor, and reduction of adverse effects on the spectral sensitivity characteristics in the long wavelength range.

A device that forms the bump electrodes 35 may physically interfere with the textured surface TS when forming the bump electrodes 35. In a case where the device that forms the bump electrodes 35 physically interferes with the textured surface TS, the textured surface TS may be physically damaged, so that the spectral sensitivity characteristics in the long wavelength range may be adversely affected.

In the semiconductor photodetector 1, the textured surface TS is located toward the main surface 11 a in comparison to the virtual plane VP. Therefore, the device that forms the bump electrodes 35 tends not to physically interfere with the textured surface TS. The semiconductor photodetector 1 reduces adverse effects on the spectral sensitivity characteristics in the long wavelength range when forming the bump electrodes 35.

In the semiconductor photodetector 1, the edge region TSa of the textured surface TS is continuous with the surface of the region 19 (regions 19*a*, 19*b*), and is inclined to the thickness direction of the semiconductor substrate 11. In a case where the textured surface TS is located toward the main surface 11 a in comparison to the virtual plane VP, stress tends to act on the region 19 further.

In the semiconductor photodetector 1, the stress acting on the region 19 tends to be dispersed as compared with in a configuration where the edge region TSa is parallel to the thickness direction of the semiconductor substrate. Therefore, even in a case where stress acts on the region 19, concentration of the stress on the region 19 decreases. The semiconductor photodetector 1 reduces generation of carriers that are not attributable to incidence of light. Consequently, the semiconductor photodetector 1 further reduces generation of the dark currents.

In the semiconductor photodetector 1, the region 19 (regions 19*a*, 19*b*) does not include the textured surface TS. In the semiconductor photodetector 1, the pad electrode 31 is easily formed on the region 19 (region 19*b*) as compared with in a configuration where the region 19 includes the textured surface TS.

Light having reached the surface of the textured surface TS is reflected or scattered by the textured surface TS as described above. The light reflected or scattered by the textured surface TS travels in various directions crossing the thickness direction of the semiconductor substrate 11 as compared with light reflected at a flat surface. Therefore, the light reflected or diffused at the textured surface TS may travel toward adjacent pixels and cause crosstalk between the pixels. Crosstalk causes noise.

In the semiconductor photodetector 1, the textured surface TS is provided for each of the semiconductor regions 15. The textured surface TS is not provided in regions of the main surface 11*b* other than the semiconductor regions 15. The configuration where the textured surface TS is provided for each of the semiconductor regions 15 regulates generation of crosstalk as compared with a configuration where the textured surface TS is provided throughout the main surface 11*b*. Therefore, the semiconductor photodetector 1 reduces generation of crosstalk.

In the semiconductor photodetector 1, the pad electrode 31 includes the electrode region 31*a* and the electrode region 31*b*. The electrode region 31*a* is disposed on the region 19 (region 19*b*). The electrode region 31*b* is disposed on the region 17 such that the insulating film 23 is located between the electrode region 31*b* and the region 17. The electrode region 31*a* is continuous with the electrode region 31*b*. That is, the pad electrode 31 is disposed to extend over the region 19*b* and the region 17. In this configuration, an area of the pad electrodes 31 is large as compared with in a configuration where the pad electrode 31 is disposed only on the region 19*b*. The UBM 33 and the bump electrode 35 are disposed on the pad electrode 31 having a large area. Therefore, the semiconductor photodetector 1 improves reliability and stability of an electrical connection between the semiconductor region 15 (region 19) and the bump electrode 35.

A configuration of the textured surface TS (region 17) having a large area improves the spectral sensitivity characteristics in the long wavelength range as compared with a configuration of the textured surface TS (region 17) having a small area. Therefore, to improve the spectral sensitivity characteristics in the long wavelength range, the region 17 having a largest possible area and the region 19 (region 19*b*) having a smallest possible area are required.

The pad electrode 31 contacts the region 19b via the contact hole H1. The contact hole H1 is formed in a region included in the insulating film 23 and located above the region 19b to easily form the contact hole H1. The contact hole H1 is easily formed in the insulating film 23 because the surface of the region 19b is flat. In a case where the pad electrode 31 is formed at a position shifted from the contact hole H1, the region 19b is exposed through the contact hole H1. In this case, breakdown voltage characteristics and reliability may deteriorate. Therefore, the area of the pad electrode 31 is set in consideration of accuracy of the formation position of the contact hole H1 and accuracy of the formation position of the pad electrode 31. Consequently, the area of the pad electrode 31 inevitably increases.

In a configuration where the pad electrode 31 does not include the electrode region 31b, the pad electrodes 31 and the regions 17 do not overlap with each other when viewed in the direction orthogonal to the main surface 11b. In this configuration, an area of the region 19b needs to increase so as to secure the area of the pad electrode 31, and the area of the region 17 is required to decrease. Therefore, the configuration where the pad electrode 31 does not include the electrode region 31b tends not to improve the spectral sensitivity characteristics in the long wavelength range.

In the semiconductor photodetector 1, the pad electrode 31 includes the electrode region 31b. That is, at least a part of the pad electrodes 31 and a part of the regions 17 overlap with each other when viewed in the direction orthogonal to the main surface 11b. Therefore, even in a case where the areas of the pad electrodes 31 are secured, the semiconductor photodetector 1 improves the spectral sensitivity characteristics in the long wavelength range.

In the semiconductor photodetector 1, the insulating film 25 covers the peripheral edges of the pad electrodes 31. Therefore, the insulating film 25 reduces separation of the pad electrodes 31. The insulating film 25 reduces entrance of a material component of the bump electrodes 35 from an interface between the pad electrodes 31 and the insulating film 23. The insulating film 25 reduces generation of leakage currents and short circuit.

In the semiconductor photodetector 1, the insulating film 25 covers a region included in the insulating film 23 and corresponding to the regions 17. A laminated film constituted by the insulating film 23 and the insulating film 25 covers the entire textured surface TS. The laminated film (insulating films 23, 25) can constitute a highly reflective film in a case where thicknesses of the insulating film 23 and the insulating film 25 is set to desired values. In a configuration where a highly reflective film is constituted by the laminated film (insulating films 23, 25), the spectral sensitivity characteristics in the long wavelength range further improve.

The insulating film 23 is the oxide film, and the insulating film 25 is the nitride film. Therefore, the laminated film (insulating films 23, 25) can easily constitute the highly reflective film.

In a case where the insulating film 23 is the silicon thermal oxide film, the protrusions and recesses of the textured surface TS are smoothed due to the heat treatment in the process of forming the insulating film 23. In a case where the protrusions and recesses of the textured surface TS are smoothed, a process of forming metal wiring including the pad electrodes 31 is easily performed.

Figure 12:
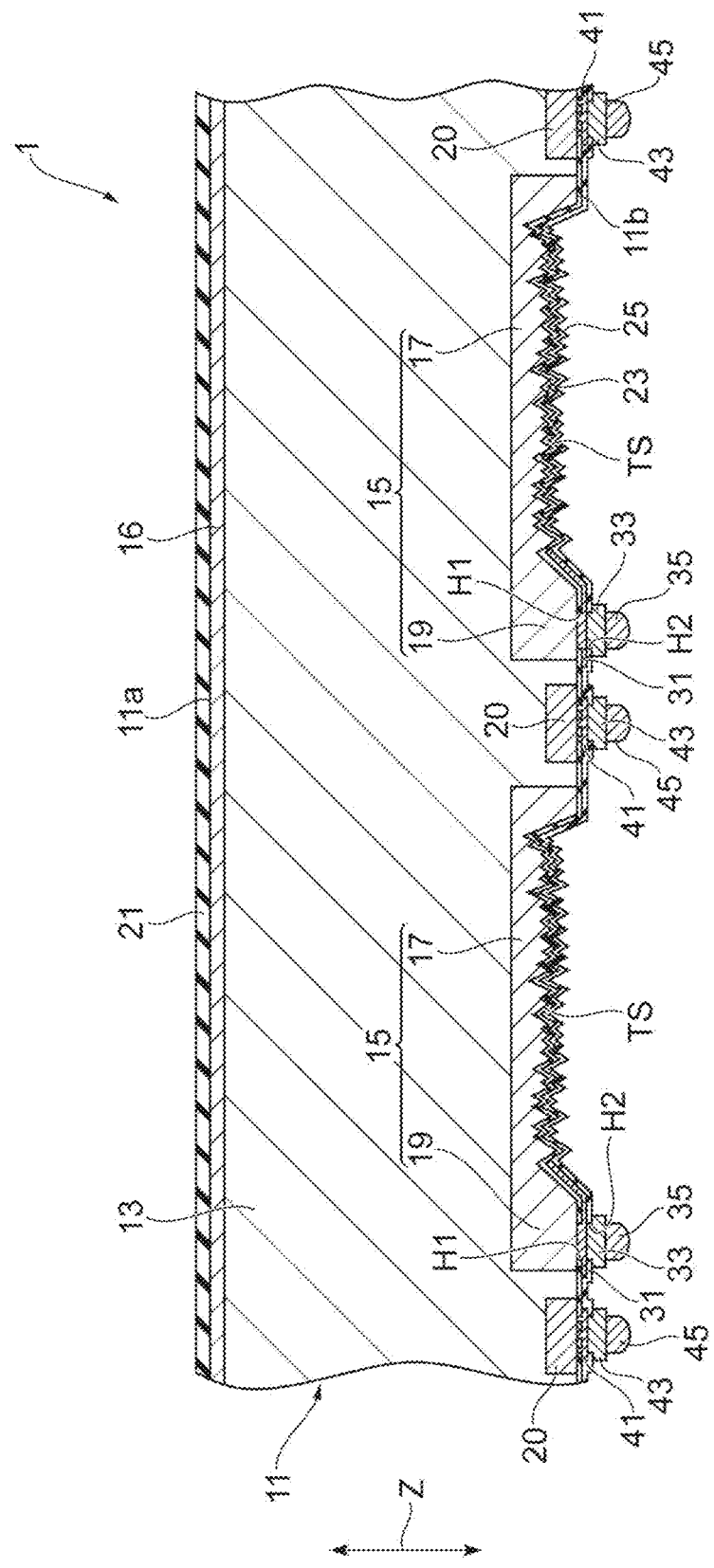
FIG. 12 is a view illustrating a cross-sectional configuration of a back-illuminated semiconductor photodetector according to a first modification of the present embodiment.
Figure 13:
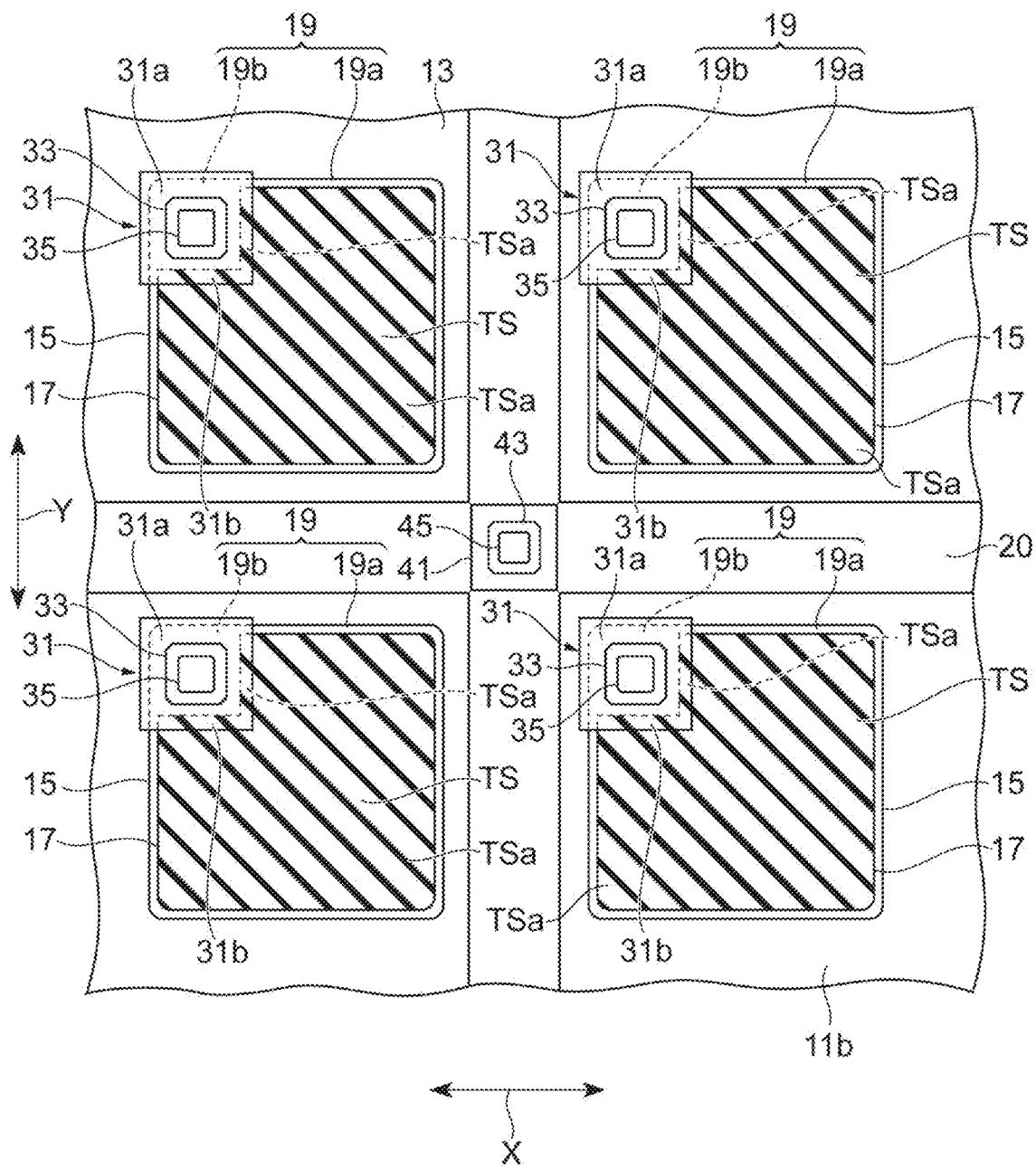
FIG. 13 is a plan view illustrating a configuration of the back-illuminated semiconductor photodetector according to the first modification.

Next, a configuration of the semiconductor photodetector 1 according to a first modification of the above embodiment will be described with reference to FIGS. 12 and 13. FIG. 12 is a view illustrating a cross-sectional configuration of a back-illuminated semiconductor photodetector according to the first modification. FIG. 13 is a plan view illustrating the configuration of the back-illuminated semiconductor photodetector according to the first modification. FIG. 13 does not illustrate the insulating films 23 and 25. In FIG. 13, a region corresponding to the textured surface TS is hatched to help easy understanding of a region constituted by the textured surface TS. The first modification is substantially similar or identical to the embodiment described above. However, the first modification is different from the above embodiment in the configuration of the semiconductor substrate 11. Differences between the above embodiment and the first modification will be hereinafter chiefly described.

The semiconductor substrate 11 includes a semiconductor region 20 of the first conductivity type. The semiconductor substrate 11 includes the semiconductor region 20 in a side of the main surface 11b. The semiconductor substrate 11 includes the semiconductor region 20 provided in the side of the main surface 11b. The semiconductor region 20 has high impurity concentration. For example, the semiconductor region 20 has impurity concentration of $1 \times 10^{18}$ cm$^{-3}$. For example, the semiconductor region 20 has a thickness of 1.5 μm. The semiconductor region 20 has a grid shape when viewed in the direction orthogonal to the main surface 11b. The semiconductor region 20 is located between the semiconductor regions 15 adjacent to each other in the first direction and between the semiconductor regions 15 adjacent to each other in the second direction when viewed in the direction orthogonal to the main surface 11b. The semiconductor region 20 is continuous with the semiconductor region 14. The semiconductor region 20 functions as a channel stop layer, and reduces a spread of a depletion layer between pixels. The semiconductor region 20 may be divided into a plurality of regions when viewed in the direction orthogonal to the main surface 11b.

The semiconductor photodetector 1 includes a plurality of pad electrodes 41, a plurality of UBMs (under-bump metals) 43, and a plurality of bump electrodes 45.

The respective pad electrodes 41 are disposed on the semiconductor region 20. The respective pad electrodes 41 are disposed at predetermined intervals when viewed in the direction orthogonal to the main surface 11b. The pad electrode 41 is formed on the insulating film 23. The pad electrode 41 is connected to the semiconductor region 20 via a contact hole formed in the insulating film 23. The pad electrode 41 is in contact with the semiconductor region 20 and the insulating film 23. The pad electrode 41 is directly disposed on the semiconductor region 20. The pad electrode 41 is in contact with the insulating film 25. The insulating film 25 covers peripheral edge of the pad electrode 41. The pad electrode 41 is made of a conductive material. The pad electrode 41 is made of aluminum, for example. In this case, the pad electrode 41 is formed with sputtering or vapor deposition.

The UBM 43 is disposed on the semiconductor region 20. The UBM 43 is formed on the semiconductor region 20 and the insulating film 25. The UBM 43 is connected to the pad electrode 41 via a contact hole formed in the insulating film 25. The UBM 43 is in contact with the pad electrode 41. The UBM 43 is in contact with the insulating film 25. The UBM 43 is made of a material having excellent electrical and physical connection with the bump electrode 45. For example, the UBM 43 is constituted by a laminated body constituted by a layer made of titanium and a layer made of platinum. For example, the UBM 43 is formed with multi-layer vapor deposition.

The bump electrode 45 is disposed on the semiconductor region 20. The bump electrode 45 is formed on the UBM 43. The bump electrode 45 is in contact with the UBM 43. The UBM 43 is located between the pad electrode 41 and the bump electrode 45. The bump electrode 45 is indirectly disposed on the semiconductor region 20. The bump electrode 45 is indirectly disposed on the pad electrode 41. The bump electrode 45 is electrically connected to the semiconductor region 20 via the UBM 43 and the pad electrode 41. The bump electrode 45 is made of a solder material. For example, the bump electrode 45 is made of indium. For example, the bump electrode 45 is formed with vapor deposition.

Figure 14:
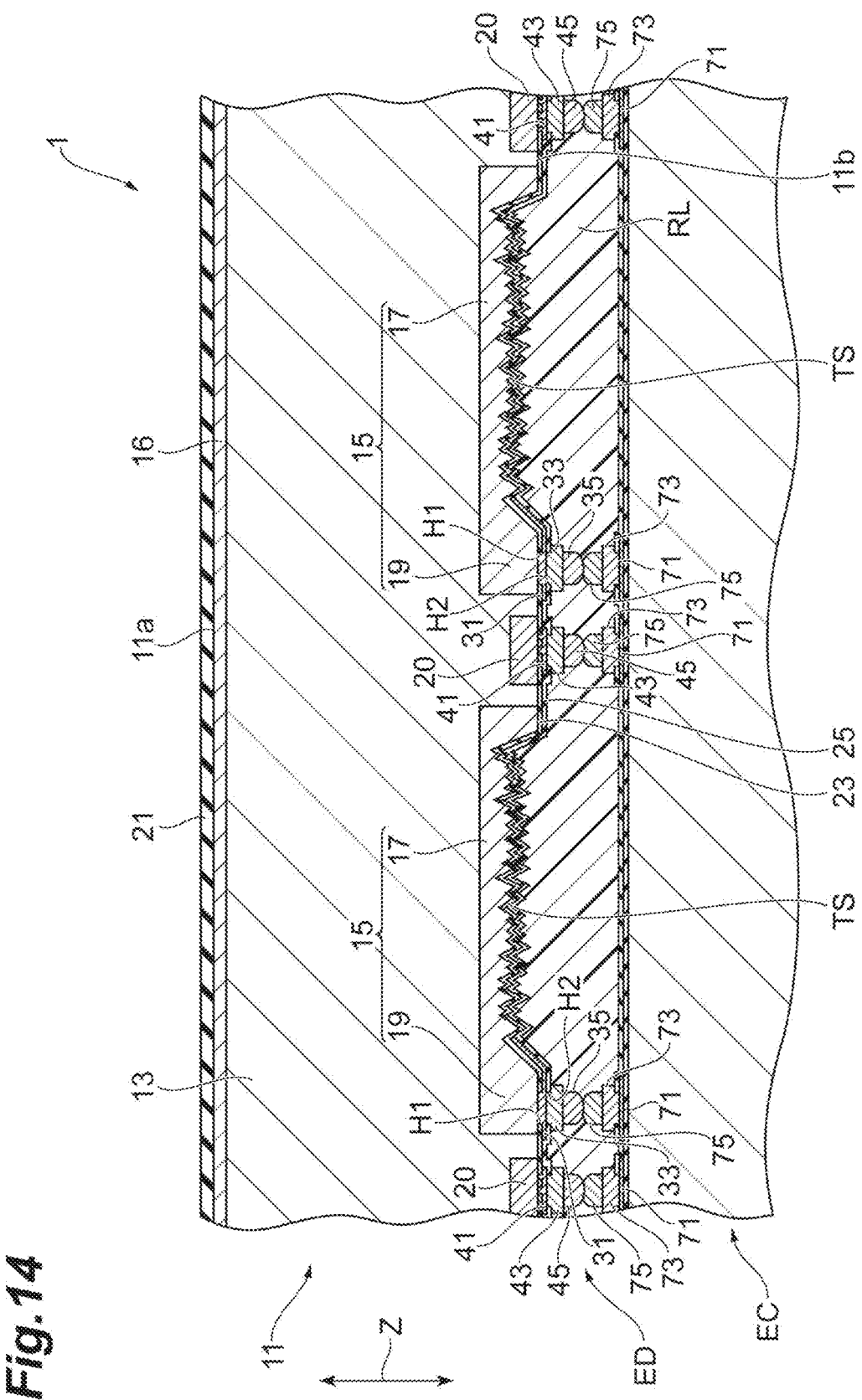
FIG. 14 is a view illustrating a cross-sectional configuration of an electronic component device that includes the back-illuminated semiconductor photodetector according to the first modification.

Next, a configuration of the electronic component device ED including the semiconductor photodetector 1 according to the first modification will be described with reference to FIG. 14. FIG. 14 is a view illustrating a cross-sectional configuration of the electronic component device that includes the back-illuminated semiconductor photodetector according to the first modification.

The electronic component device ED includes the semiconductor photodetector 1 according to the first modification, and the electronic component EC. The electronic component EC includes a plurality of pad electrodes 71, a plurality of UBMs 73, and a plurality of bump electrodes 75. The plurality of pad electrodes 71, the plurality of UBMs 73, and the plurality of bump electrodes 75 are disposed at positions corresponding to the plurality of bump electrodes 35 and 45 included in the semiconductor photodetector 1. The semiconductor photodetector 1 is mounted on the electronic component EC due to joining the bump electrodes 35 and 45 and the bump electrodes 75 associated with each other.

Figure 15:
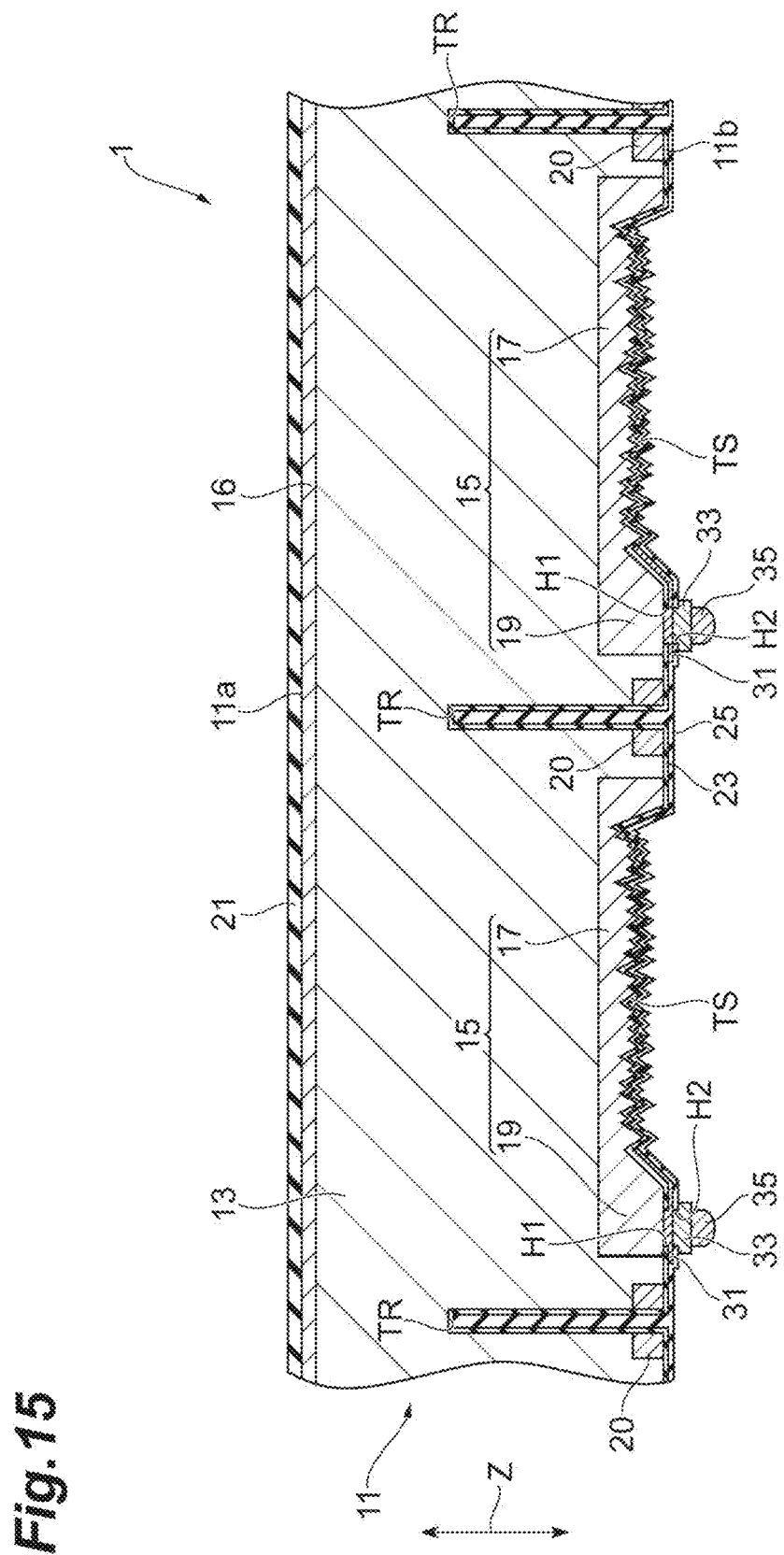
FIG. 15 is a view illustrating a cross-sectional configuration of a back-illuminated semiconductor photodetector according to a second modification of the present embodiment.
Figure 16:
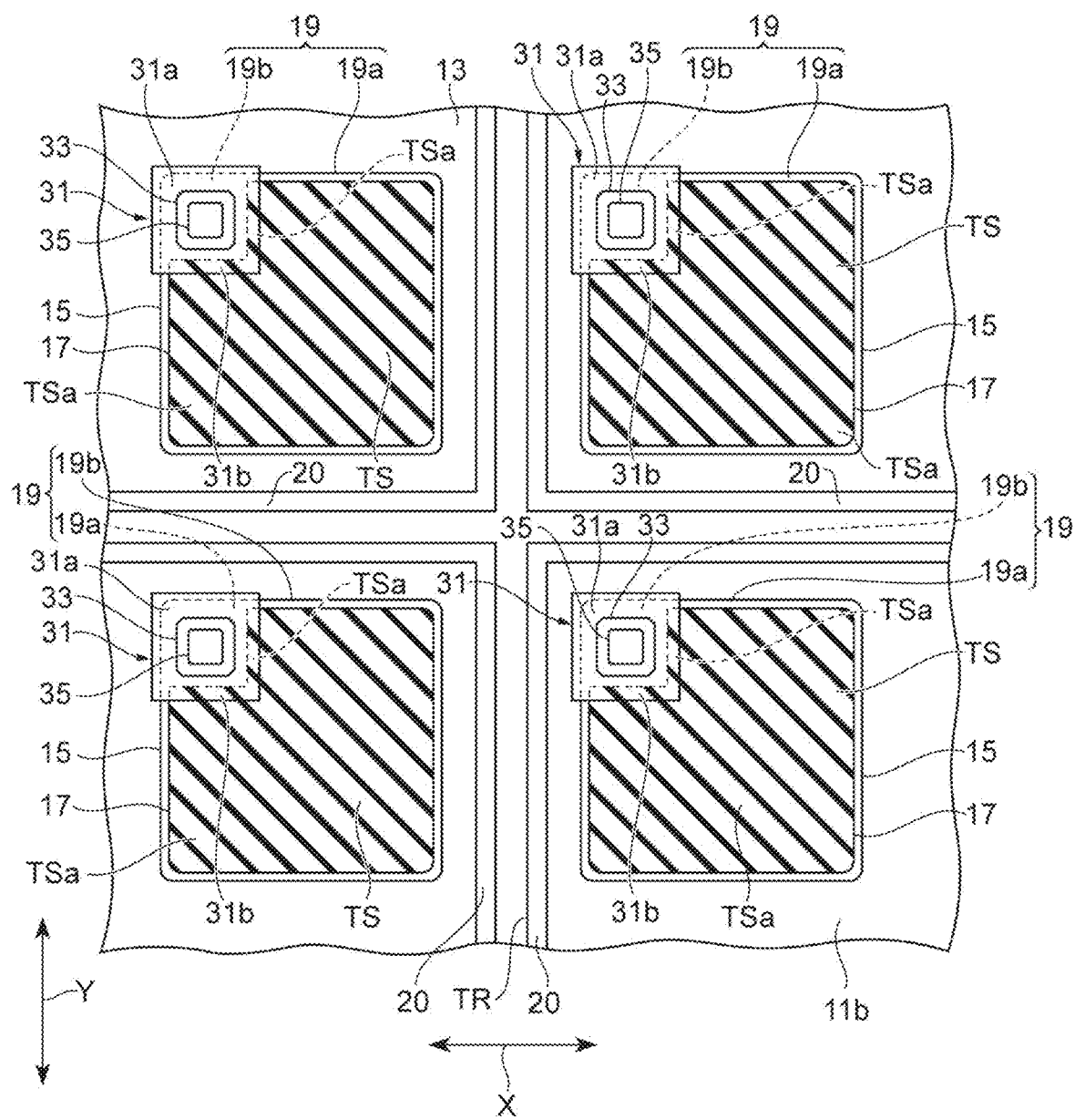
FIG. 16 is a plan view illustrating a configuration of the back-illuminated semiconductor photodetector according to the second modification.

Next, a configuration of the semiconductor photodetector 1 according to a second modification of the above embodiment will be described with reference to FIGS. 15 and 16. FIG. 15 is a view illustrating a cross-sectional configuration of a back-illuminated semiconductor photodetector according to the second modification. FIG. 16 is a plan view illustrating the configuration of the back-illuminated semiconductor photodetector according to the second modification. FIG. 16 does not illustrate the insulating films 23 and 25. In FIG. 16, a region corresponding to the textured surface TS is hatched to help easy understanding of a region constituted by the textured surface TS. The second modification is substantially similar or identical to the embodiment described above. However, the second modification is different from the above embodiment in the configuration of the semiconductor substrate 11. Differences between the above embodiment and the second modification will be hereinafter chiefly described.

A trench TR is formed in the semiconductor substrate 11 to separate the respective pixels from each other. The trench TR is opened in the main surface 11b. The trench TR is formed to divide the semiconductor region 20 when viewed in the direction orthogonal to the main surface 11b. The trench TR has a grid shape in such a manner as to pass between the semiconductor regions 15 adjacent to each other in the first direction, and between the semiconductor regions 15 adjacent to each other in the second direction when viewed in the direction orthogonal to the main surface 11b. For example, the opening of trench TR has a width of 5 μm. The trench TR has a depth larger than the thickness TH2. For example, the trench TR has a depth of 50 μm. For example, the trench TR is formed with reactive ion etching (RIE). The trench TR may be formed discontinuously when viewed in the direction orthogonal to main surface 11b. In this case, for example, a plurality of trenches extending in the first direction when viewed in the direction orthogonal to the main surface 11b, and a plurality of trenches extending in the second direction when viewed in the direction orthogonal to the main surface 11b are formed in the semiconductor substrate 11.

The insulating film 23 is formed on an inner surface (specifically, side surface and bottom surface) of the trench TR. The insulating film 23 reaches the inside of the trench TR from the upper side of the main surface 11b. The insulating film 25 is formed on the insulating film 23 formed on the inner surface of the trench TR. The insulating film 25 extends from the upper side of the insulating film 23 located on the main surface 11b into the trench TR. A buried layer may be disposed in the trench TR. The buried layer is made of metal, for example. In this case, the buried layer (metal layer) is formed with CVD or electrolytic plating, for example.

The trench TR prevents light reflected or diffused at the textured surface TS from traveling toward an adjacent pixel. Therefore, the semiconductor photodetector 1 according to the second modification further reduces generation of crosstalk. The trench TR also prevents carriers from moving between adjacent pixels.

The semiconductor photodetector 1 according to the second modification may be mounted on the electronic component EC as illustrated in FIG. 11. In this case, the electronic component device ED includes the semiconductor photodetector 1 according to the second modification, and the electronic component EC.

Figure 17:
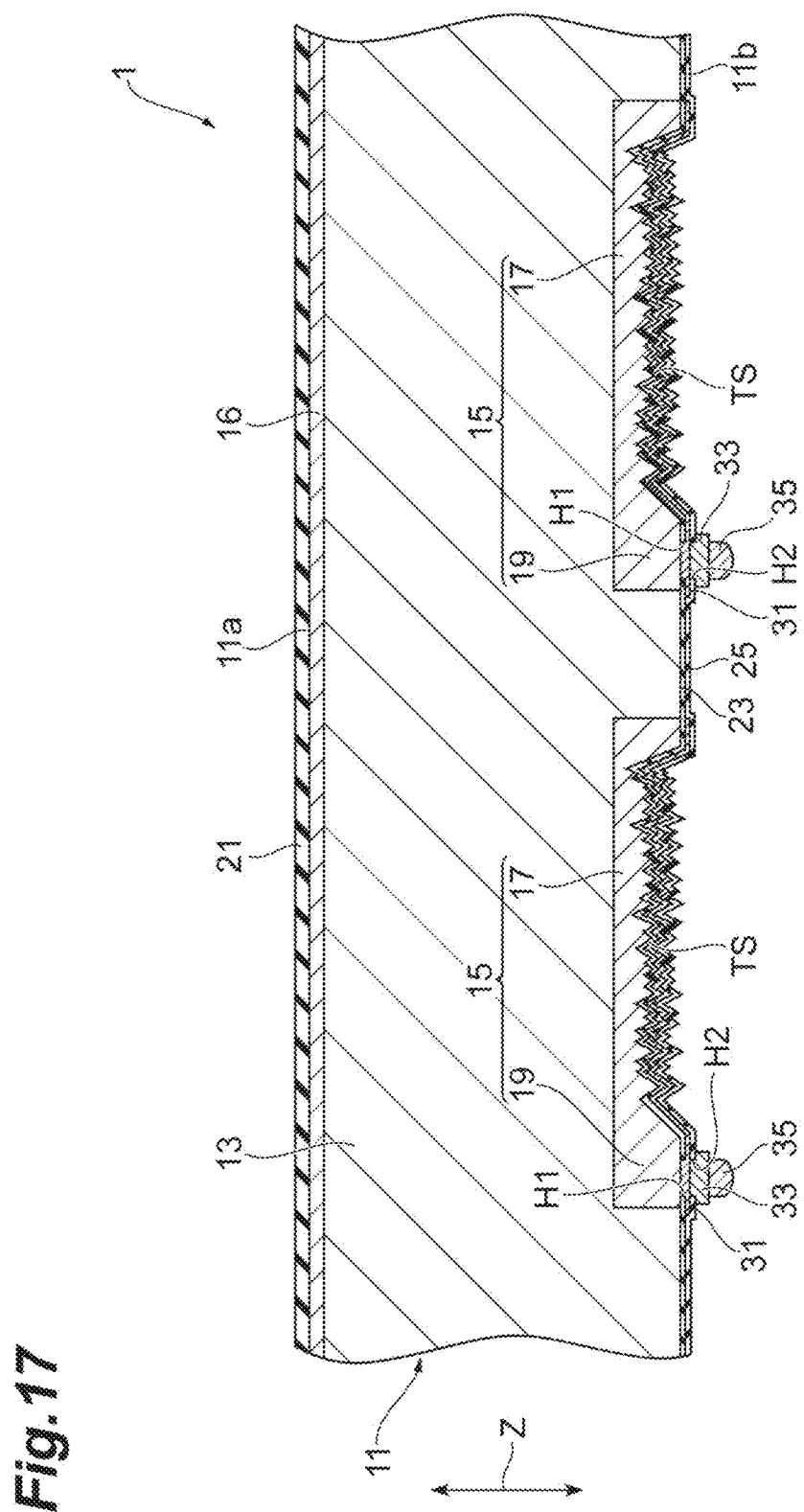
FIG. 17 is a view illustrating a cross-sectional configuration of a back-illuminated semiconductor photodetector according to a third modification of the present embodiment.
Figure 18:
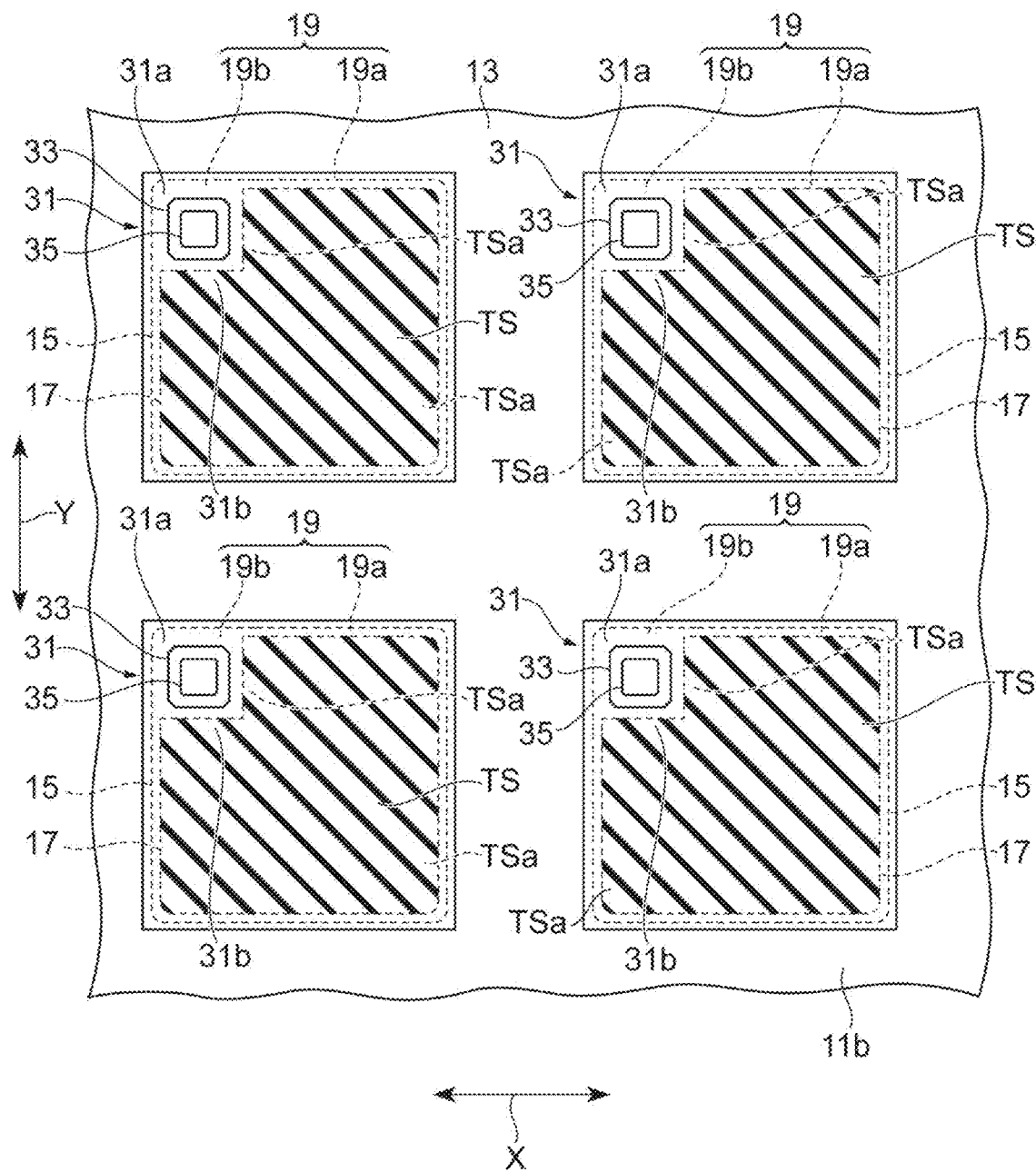
FIG. 18 is a plan view illustrating a configuration of the back-illuminated semiconductor photodetector according to the third modification.

Next, a configuration of the semiconductor photodetector 1 according to a third modification of the above embodiment will be described with reference to FIGS. 17 and 18. FIG. 17 is a view illustrating a cross-sectional configuration of a back-illuminated semiconductor photodetector according to the third modification. FIG. 18 is a plan view illustrating a configuration of the back-illuminated semiconductor photodetector according to the third modification. FIG. 18 does not illustrate the insulating films 23 and 25. In FIG. 18, a region corresponding to the textured surface TS is hatched to help easy understanding of a region constituted by the textured surface TS. The third modification is substantially similar or identical to the embodiment described above. However, the third modification is different from the above embodiment in the configuration of the pad electrodes 31. Differences between the above embodiment and the third modification will be hereinafter chiefly described.

The pad electrode 31 is disposed to cover the entire semiconductor region 15 when viewed in the direction orthogonal to the semiconductor substrate 11. The electrode region 31b is indirectly disposed on an entire region included in the insulating film 23 and corresponding to the region 17. The electrode region 31b overlaps with the entire edge region TSa that is continuous with the region 19 (regions 19a, 19b) when viewed in the direction orthogonal to the semiconductor substrate 11. The pad electrode 31 overlaps with an entire boundary between the region 17 and the region 19 when viewed in the direction orthogonal to the semiconductor substrate 11. The pad electrode 31 is indirectly disposed on the entire semiconductor region 15.

In a case where the pad electrodes 31 are made of Al, the pad electrodes 31 may absorb light having reached the pad electrodes 31 (for example, near infrared light). Absorption of light by the pad electrodes 31 deteriorates the spectral sensitivity characteristic in the long wavelength range.

In the semiconductor photodetector 1, the insulating films 23 and 25 disposed on the textured surface TS reflect or diffuse the light having reached the insulating films 23 and 25. Therefore, light transmitted through the insulating films 23 and 25 decreases. Consequently, the semiconductor photodetector 1 reduces deterioration of the spectral sensitivity characteristics in the long wavelength range.

Figure 19:
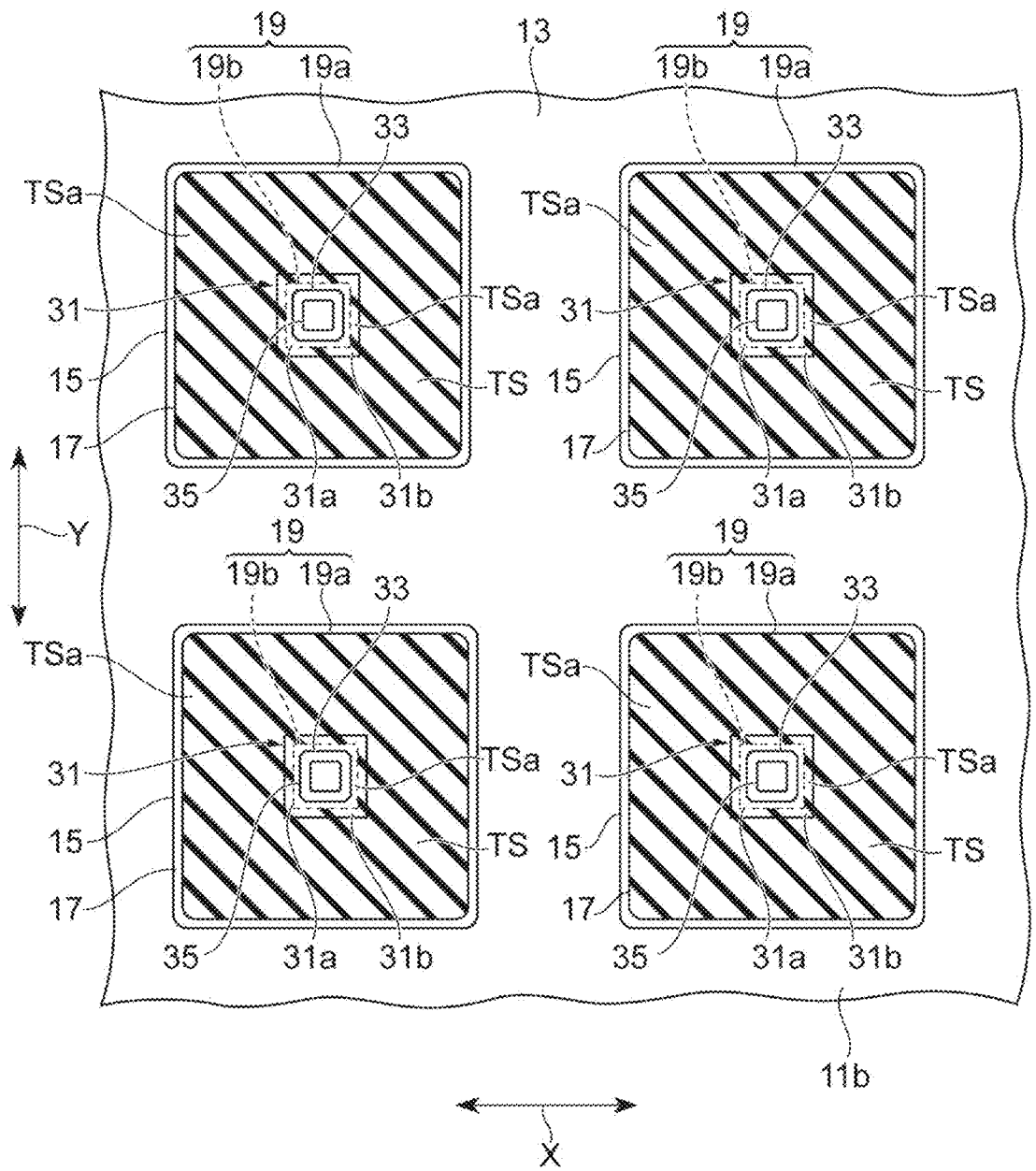
FIG. 19 is a plan view illustrating a configuration of a back-illuminated semiconductor photodetector according to a fourth modification of the present embodiment.
Figure 20:
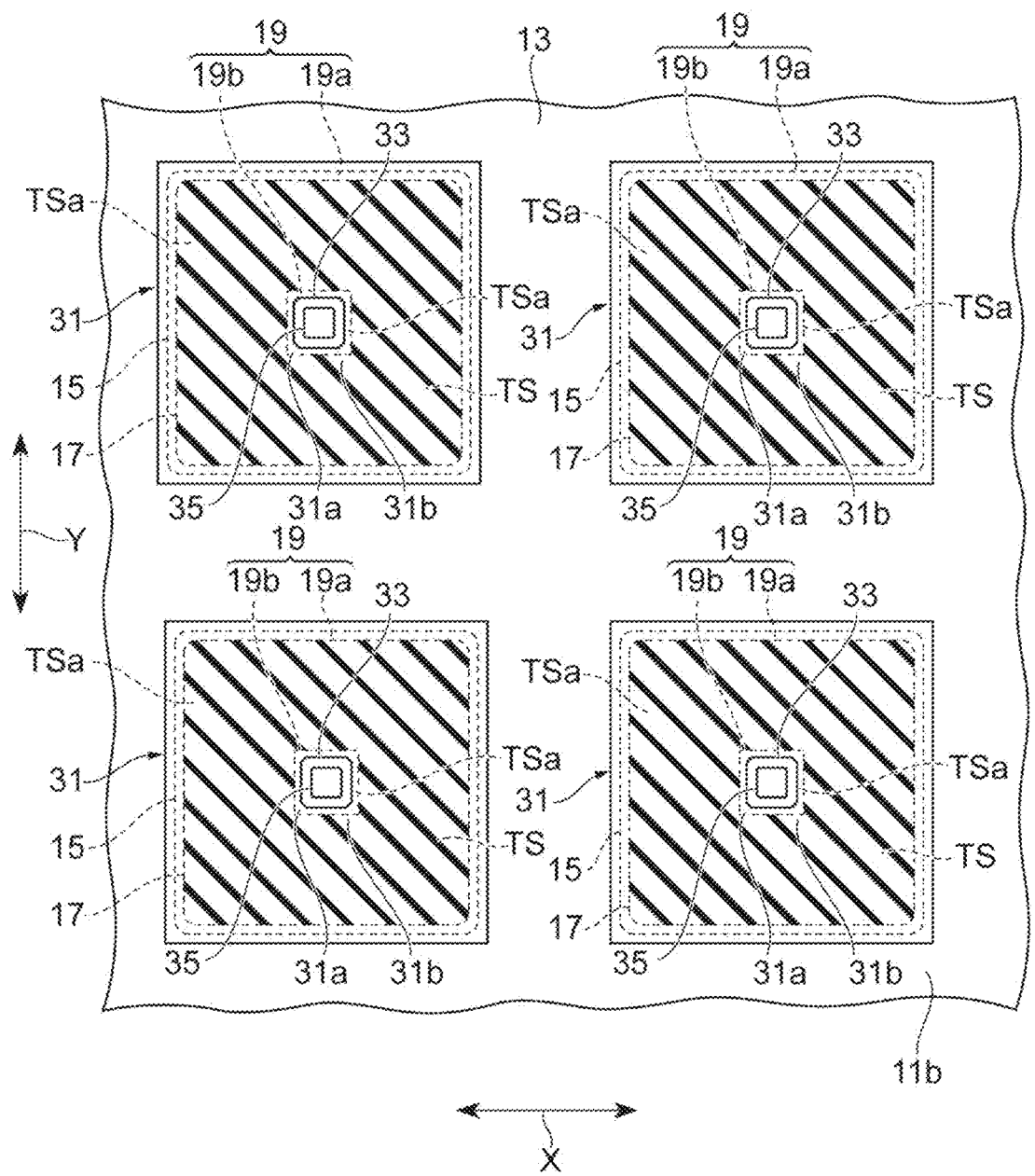
FIG. 20 is a plan view illustrating a configuration of a back-illuminated semiconductor photodetector according to a fifth modification of the present embodiment.

Next, a configuration of the semiconductor photodetector 1 according to fourth and fifth modifications of the above embodiment will be described with reference to FIGS. 19 and 20. FIG. 19 is a plan view illustrating the configuration of a back-illuminated semiconductor photodetector according to the fourth modification. FIG. 20 is a plan view illustrating the configuration of a back-illuminated semiconductor photodetector according to the fifth modification. FIGS. 19 and 20 do not illustrate the insulating films 23 and 25. In FIGS. 19 and 20, a region corresponding to the textured surface TS is hatched to help easy understanding of a region constituted by the textured surface TS. The fourth and fifth modifications are substantially similar or identical to the embodiment described above. However, the fourth modification is different from the above embodiment in the configuration of the semiconductor regions 15, and the fifth modification is different from the above embodiment in the configuration of the semiconductor regions 15 and the pad electrodes 31. Differences between the above embodiment and the fourth and fifth modifications will be hereinafter chiefly described.

As illustrated in FIG. 19, the region 19b is located at a center of the semiconductor region 15 when viewed in the direction orthogonal to the semiconductor substrate 11. The region 19b is separated from the region 19a. The region 17 (textured surface TS) is located between the region 19a and the region 19b when viewed in the direction orthogonal to the semiconductor substrate 11. The electrode region 31b overlaps with the entire edge region TSa that is continuous with the region 19b when viewed in the direction orthogonal to the semiconductor substrate 11. The pad electrode 31 overlaps with an entire boundary between the region 17 and the region 19b when viewed in the direction orthogonal to the semiconductor substrate 11.

Similarly to the fourth modification, the region 19b is located at the center of the semiconductor region 15 when viewed in the direction orthogonal to the semiconductor substrate 11 as illustrated in FIG. 20. Similarly to the third modification, the pad electrode 31 is disposed to cover the entire semiconductor region 15 when viewed in the direction orthogonal to the semiconductor substrate 11. The electrode region 31b overlaps with the entire edge region TSa that is continuous with the region 19a, and the entire edge region TSa that is continuous with the region 19b when viewed in the direction orthogonal to the semiconductor substrate 11. The pad electrode 31 overlaps with an entire boundary between the regions 17 and 19a, and an entire boundary between the regions 17 and 19b when viewed in the direction orthogonal to the semiconductor substrate 11.

In the configuration where the region 19b is located at the center of the semiconductor region 15, a carrier moving distance is short, and a time from incidence of light to output of a signal is short as compared with in a configuration where the region 19b is located at one corner of the semiconductor region 15. Therefore, the semiconductor photodetector 1 increases a response speed in each of the fourth and fifth modifications.

Figure 21:
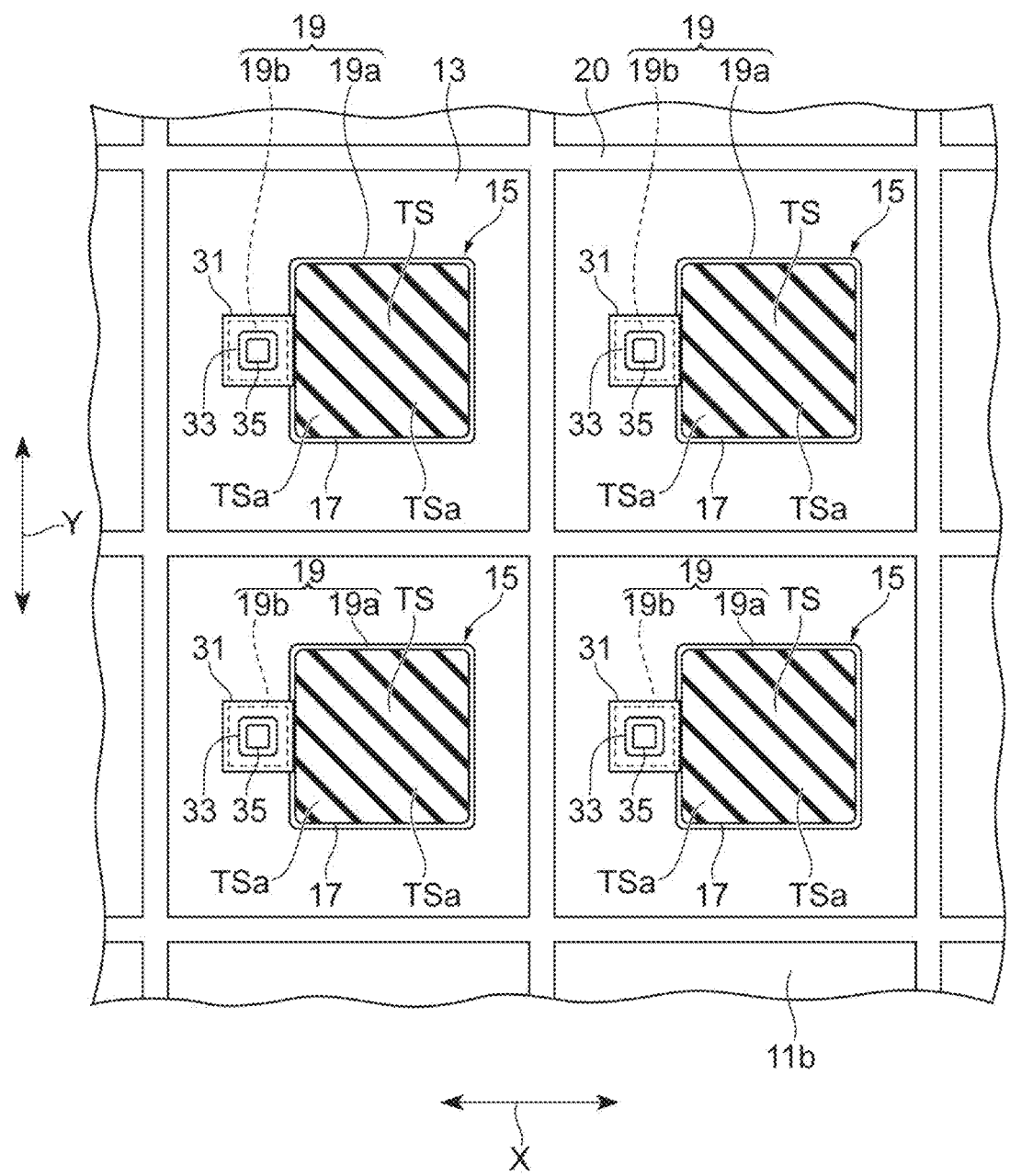
FIG. 21 is a plan view illustrating a configuration of a back-illuminated semiconductor photodetector according to a sixth modification of the present embodiment.

Next, a configuration of a semiconductor photodetector according to a sixth modification of the above embodiment will be described with reference to FIG. 21. FIG. 21 is a plan view illustrating a configuration of a back-illuminated semiconductor photodetector according to the sixth modification. FIG. 21 does not illustrate the insulating films 23 and 25. In FIG. 21, a region corresponding to the textured surface TS is hatched to help easy understanding of a region constituted by the textured surface TS. The sixth modification is substantially similar or identical to the embodiment described above. However, the sixth modification is different from the above embodiment in the configuration of the semiconductor regions 15 and the pad electrodes 31. Differences between the above embodiment and the sixth modification will be hereinafter chiefly described.

The region 17 and the region 19b are adjacent to each other in the first direction when viewed in the direction orthogonal to the semiconductor substrate 11. The region 17 and the regions 19a and 19b has a rectangular shape when viewed in the direction orthogonal to the semiconductor substrate 11. The region 19b is located outside the region 19a. One side constituting an edge of the region 19a is in contact with one side constituting an edge of the region 19b. An area of the region 19b is smaller than an area of the region 19a when viewed in the direction orthogonal to the semiconductor substrate 11. The pad electrode 31 is not located on the region 17 (textured surface TS). That is, the pad electrode 31 does not include the electrode region 31b. The pad electrode 31 does not overlap with the textured surface TS when viewed in the direction orthogonal to the semiconductor substrate 11. In the sixth modification, the semiconductor substrate 11 includes the semiconductor region 20. However, the semiconductor substrate 11 is not required to include the semiconductor region 20. The region 17 and the region 19b may be adjacent to each other in the second direction when viewed in the direction orthogonal to the semiconductor substrate 11.

Figure 22:
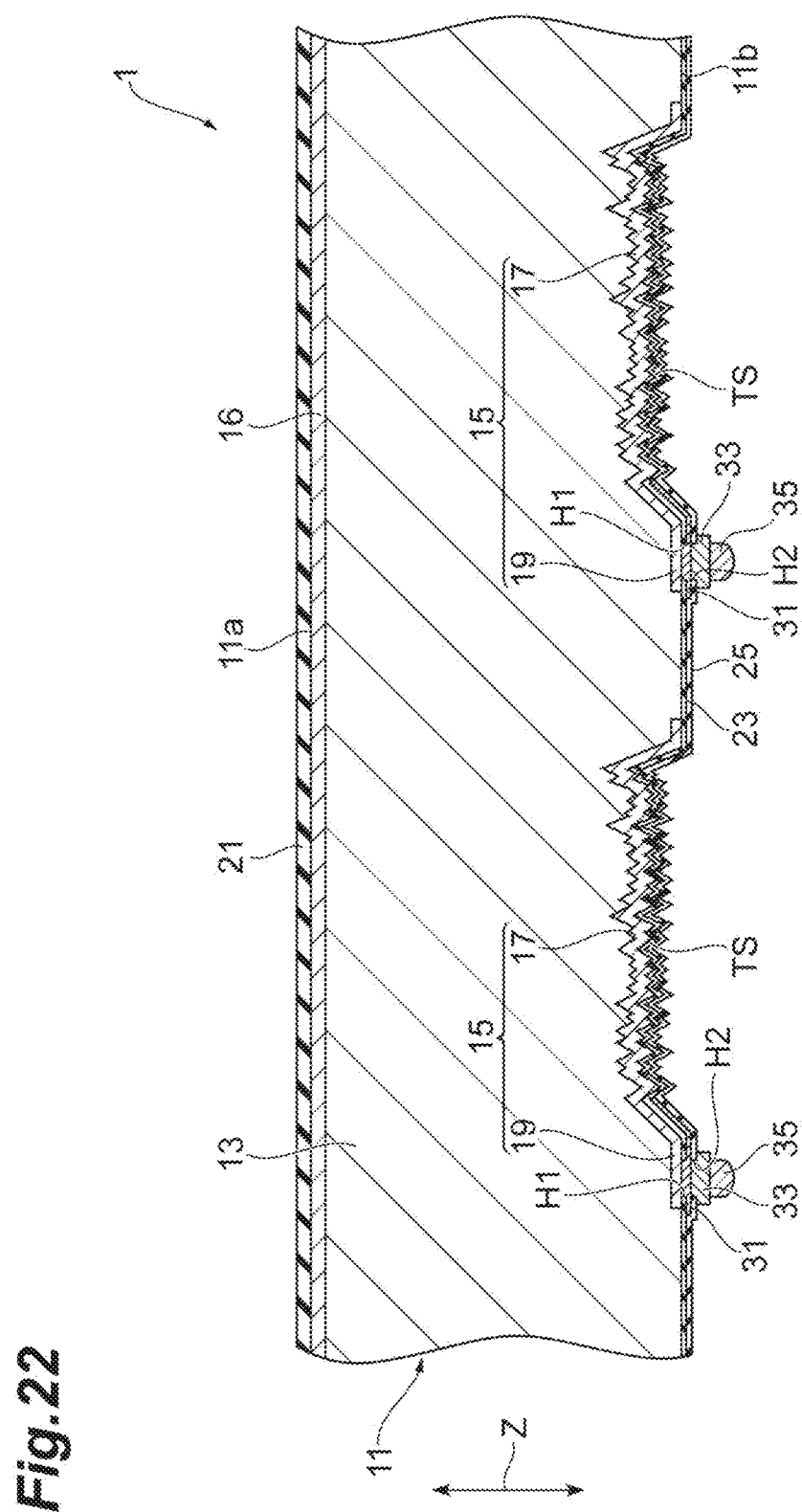
FIG. 22 is a view illustrating a cross-sectional configuration of a back-illuminated semiconductor photodetector according to a seventh modification of the present embodiment.
Figure 23:
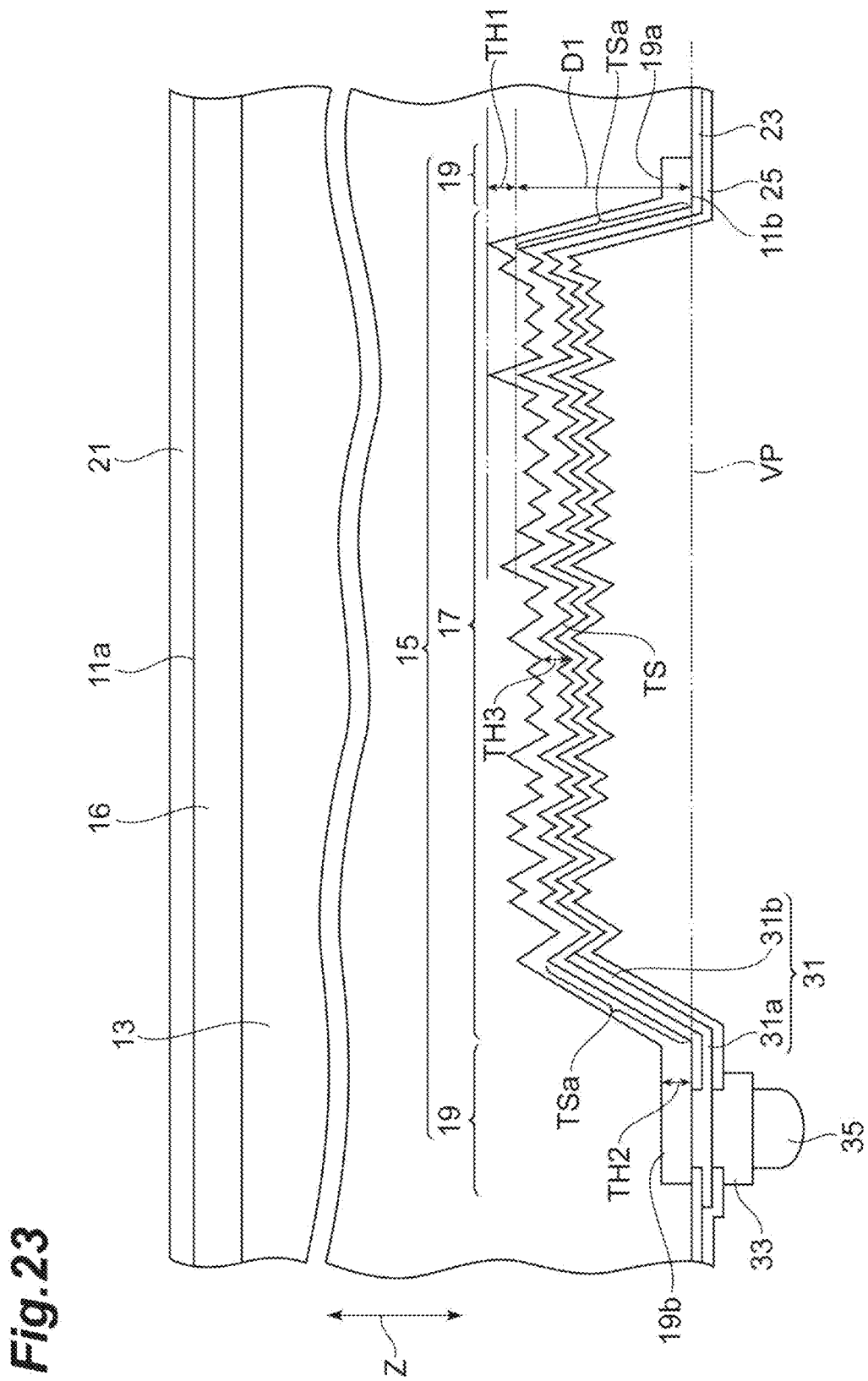
FIG. 23 is a view illustrating a cross-sectional configuration of one pixel.

Next, a configuration of the semiconductor photodetector 1 according to a seventh modification of the above embodiment will be described with reference to FIGS. 22 and 23. FIG. 22 is a view illustrating a cross-sectional configuration of a back-illuminated semiconductor photodetector according to the seventh modification. FIG. 23 is a view illustrating a cross-sectional configuration of one pixel. In FIG. 23, hatching for indicating a cross section is omitted. The seventh modification is substantially similar or identical to the embodiment described above. However, the seventh modification is different from the above embodiment in the configuration of the semiconductor regions 15. Differences between the above embodiment and the seventh modification will be hereinafter chiefly described.

The region 17 of the semiconductor region 15 is formed along the textured surface TS. A boundary interface between the region 17 and the semiconductor region 13 includes protrusions and recesses corresponding to the protrusions and recesses of the textured surface TS. For example, the boundary interface between the region 17 and the semiconductor region 13 includes protrusions and recesses that are more gradual than the protrusions and recesses of the textured surface TS. The region 19 of the semiconductor region 15 is formed along the main surface 11b. The thickness TH2 of the region 19 in the thickness direction of the semiconductor substrate 11 is equal to the thickness TH3 of the region 17 in the thickness direction of the semiconductor substrate 11. As described above, the region 17 is formed along the textured surface TS. Therefore, the thickness TH3 tends not to change in correspondence with the protrusions and recesses of the textured surface TS. In the seventh modification, the thickness TH3 is approximately constant, for example. The thickness TH1 of the region 17 at the deepest position of the recesses of the textured surface TS is equal to each of the thickness TH2 and the thickness TH3. For example, the thickness TH1, the thickness TH2, and the thickness TH3 are 0.5 µm.

The semiconductor substrate 11 may include the semiconductor region 20 similarly to the first modification. The trench TR may be formed in the semiconductor substrate 11 similarly to the second modification. The pad electrodes 31 may be disposed to cover the entire semiconductor region 15 similarly to the third modification. The region 19b may be located at the center of the semiconductor region 15 when viewed in the direction orthogonal to the semiconductor substrate 11, similarly to the fourth and fifth modifications. The region 17 and the region 19b may be adjacent to each other in the first direction or the second direction when viewed in the direction orthogonal to the semiconductor substrate 11, similarly to the r sixth modification.

Figure 25:
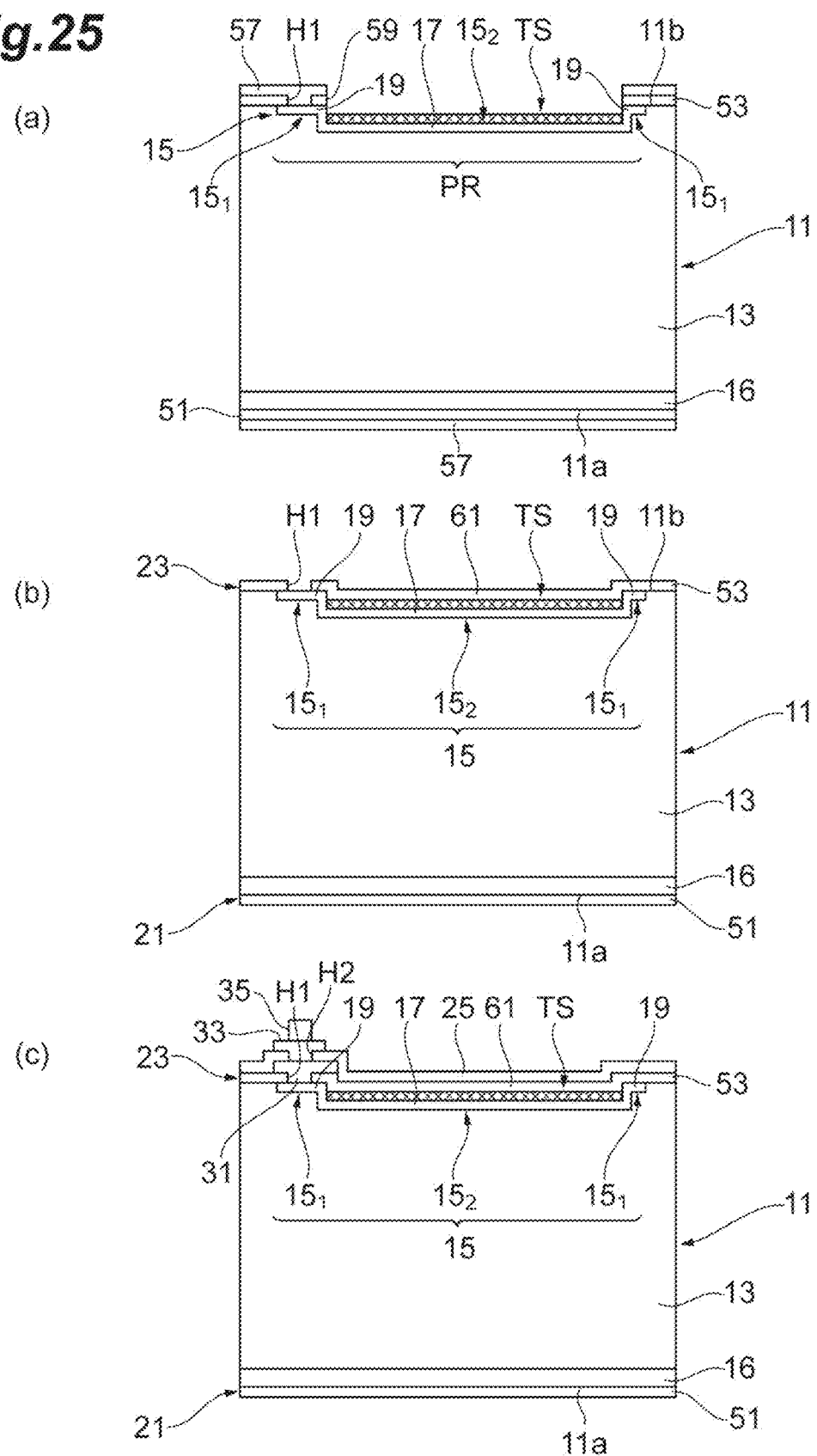
FIG. 25 is a schematic diagram illustrating an example of the manufacturing process of the back-illuminated semiconductor photodetector according to the seventh modification.

Next, an example of a manufacturing process of the semiconductor photodetector 1 according to the seventh modification will be described with reference to FIGS. 24 and 25. Each of FIGS. 24 and 25 is a schematic diagram illustrating an example of the manufacturing process of the back-illuminated semiconductor photodetector according to the seventh modification. In FIGS. 24 and 25, hatching for indicating a cross section is omitted. Differences between the above embodiment and the seventh modification in the manufacturing process will be hereinafter chiefly described.

The semiconductor substrate 11 that includes the oxide film 51 on the main surface 11a and the oxide film 53 on the main surface 11b is provided (see FIG. 9(a)). That is, the semiconductor substrate 11 including the semiconductor region 13 is provided. The semiconductor substrate 11 includes a plurality of planned regions PR where the plurality of semiconductor regions 15 are going to be formed, in a side of the main surface 11b. In FIGS. 24 and 25, only one planned region PR is illustrated.

As illustrated in FIG. 24(a), the plurality of semiconductor regions $15_1$ and the semiconductor region 16 are formed on the semiconductor substrate 11. Each of the semiconductor region $15_1$ is formed in a corresponding planned region PR of the plurality of planned regions PR. The semiconductor regions $15_1$ are formed with the same process as the process of forming the semiconductor regions 15 in the above embodiment. The semiconductor region $15_1$ is constituted by high-concentration p-type impurities diffused from the main surface 11b. The semiconductor region 16 is formed with the same process as the process of forming the semiconductor region 16 in the above embodiment.

As illustrated in FIG. 24(b), the contact hole H1, the silicon nitride film 57, and the opening 59 are formed with the same processes as the corresponding forming processes of the above embodiment.

As illustrated in FIG. 24(c), the textured surface TS is formed in a region included in the semiconductor region $15_1$ and exposed through the opening 59 with the same processes as the corresponding forming processes of the above embodiment. That is, a plurality of textured regions are formed on surfaces included in the plurality of planned regions PR described above in the main surface 11b. The textured region is a region that includes a surface constituting the textured surface TS.

The region included in the semiconductor region $15_1$ and exposed from the opening 59 is removed due to forming the textured surface TS. The region included in the semiconductor region $15_1$ and exposed from the opening 59 need not be completely removed, but a part of the region exposed through the opening 59 may be left. In FIG. 24(c) and subsequent figures, a cross-hatched region is a region where the textured surface TS is formed.

As illustrated in FIG. 25(a), a plurality of semiconductor regions $15_2$ are formed on the semiconductor substrate 11. The semiconductor region $15_2$ is formed along the textured surface TS. That is, the semiconductor regions $15_2$ is formed along a surface shape of the textured region. Each of the semiconductor regions $15_2$ is formed in the corresponding planned region PR of the plurality of planned regions PR. The semiconductor regions $15_2$ are formed with the same process as the process of forming the semiconductor regions 15 in the above embodiment. The semiconductor regions $15_2$ are constituted by high-concentration p-type impurities diffused from the main surface 11b. The p-type impurities also diffuse in the direction orthogonal to the thickness direction of the semiconductor substrate 11. Therefore, the semiconductor region $15_2$ is formed continuously with the semiconductor region $15_1$. The semiconductor region $15_2$ and the semiconductor region $15_1$ are integrated to constitute the semiconductor region 15. The semiconductor region $15_2$ constitutes the region 17. The semiconductor region $15_1$ constitutes the region 19. That is, the plurality of semiconductor regions 15 are formed in the semiconductor substrate 11 with this process. The oxide film 61 is formed on the textured surface TS due to a high temperature heat treatment for forming the semiconductor regions $15_2$ (see FIG. 25(b)). The oxide films 53 and 61 constitute the insulating film 23.

As illustrated in FIG. 25(b), the silicon nitride film 57 is removed from the oxide film 51 and the insulating film 23 (oxide films 53, 61). The semiconductor region 15 (semiconductor region $15_1$) is exposed through the contact holes H1 due to removing the silicon nitride film 57. Thereafter, as illustrated in FIG. 25(c), the pad electrode 31, the insulating film 25, the UBM 33, and the bump electrode 35 are formed with the same processes as the corresponding forming processes of the above embodiment. The semiconductor photodetector 1 according to the seventh modification is obtained with these processes. The oxide film 51 constitutes the insulating film 21.

Figure 26:
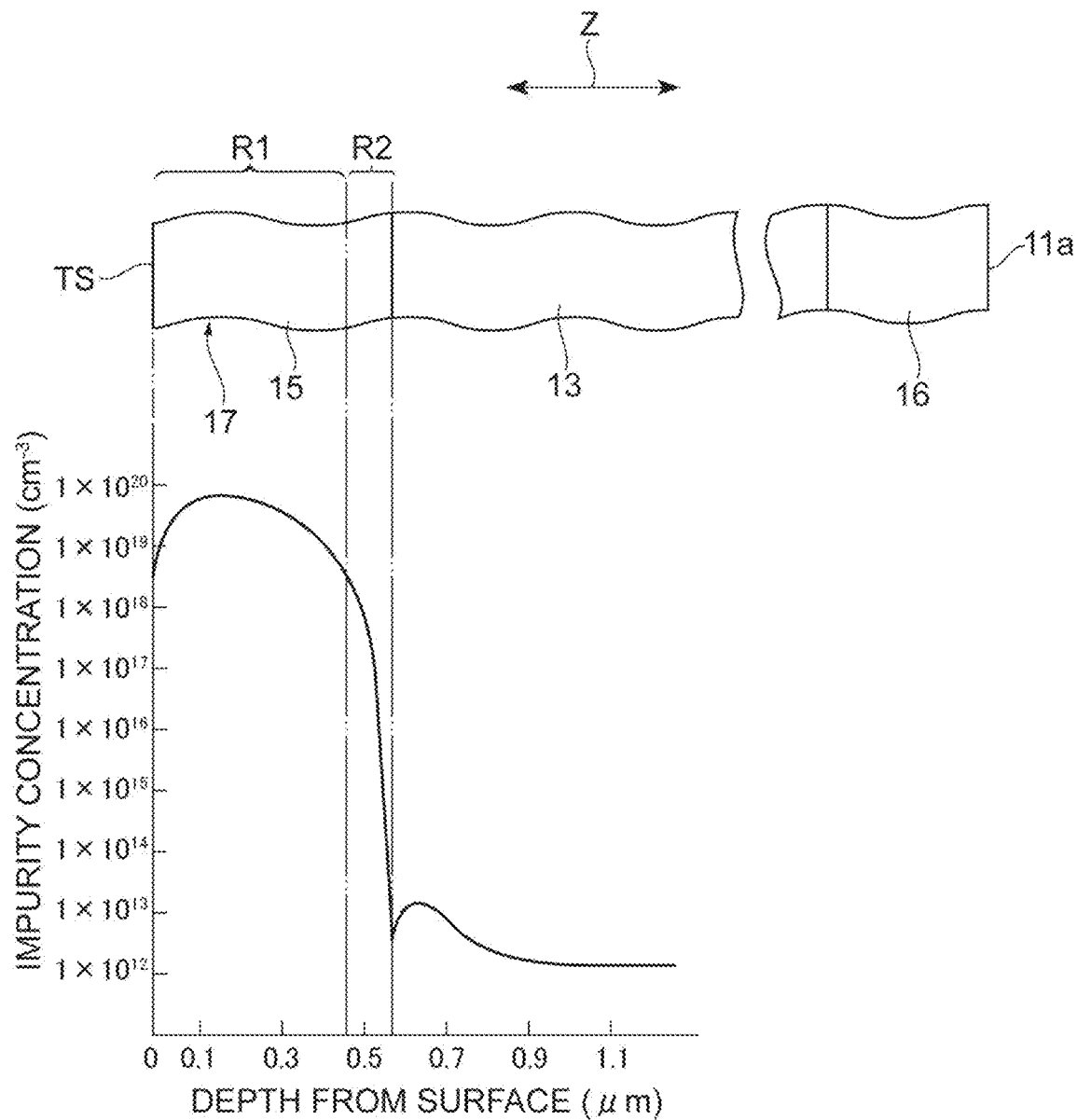
FIG. 26 is a chart illustrating a distribution of impurity concentration.

For example, impurity concentration of the semiconductor regions $15_2$ changes with a depth from the front surfaces as illustrated in FIG. 26. That is, the impurity concentration of the semiconductor regions $15_2$ changes with a distance from the textured surfaces TS in the thickness direction of the semiconductor substrate 11, for example. FIG. 26 is a chart illustrating a distribution of the impurity concentration. FIG. 26 illustrates the textured surface TS and an interface between the semiconductor region $15_2$ and the semiconductor region 13 flat, for convenience of illustration. Actually, however, the textured surface TS and the interface between the semiconductor region $15_2$ and the semiconductor region 13 exhibit fine protrusions and recesses as described above.

The impurity concentration of the semiconductor regions $15_2$ is also kept high up to a position of a predetermined depth, and gradually decreases from the position of the predetermined depth toward the main surface 11a. The semiconductor region $15_2$ includes the region R1 and the region R2 on the basis of a distribution of impurity concentration. That is, in the seventh modification, the region 17 includes the region R1 and the region R2. In the semiconductor region $15_2$ (region 17), an occupancy of the region R2 is higher than an occupancy of the region R1. In the seventh modification, a deepest position of the recesses of the textured surface TS is separated from a region where the impurity concentration of the semiconductor regions 15 begins to decrease by a thickness of the region R1. In the seventh modification, the predetermined depth is approximately 0.45 µm, for example.

In the manufacturing process of the seventh modification, the plurality of semiconductor regions 15 (the plurality of semiconductor regions 15₂) are formed in the plurality of planned regions PR after the textured region is formed on the main surface 11b. In a process where the textured regions (textured surfaces TS) are formed after forming the plurality of semiconductor regions 15, the thickness of each of the semiconductor regions 15 inevitably increases to reliably prevent the texture regions from reaching the pn junctions. Therefore, in the process of forming the plurality of semiconductor regions 15 after forming the textured regions, each thickness of the semiconductor regions 15 can be reduced as compared with in the process of forming the textured regions after forming the plurality of semiconductor regions 15. Consequently, the semiconductor photodetector 1 according to the seventh modification can further improve the spectral sensitivity characteristics in the long wavelength range.

In the manufacturing process of the seventh modification, the semiconductor region 15₂ (region 17) is formed along the surface shape of the textured region. In this case, the thickness of the semiconductor region 15₂ (region 17) can be further reduced. Therefore, the semiconductor photodetector 1 can further improve the spectral sensitivity characteristics in the long wavelength range with reliability.

In the manufacturing process of the seventh modification, the semiconductor regions 15₂ (regions 17) are formed due to adding p-type impurities into the planned region PR. In this case, the semiconductor regions 15₂ are easily formed due to using an existing method.

Although the embodiment and the modifications of the present invention have been described, the present invention is not necessarily limited to the embodiment and the modifications described above, but may be modified in various ways without departing from the spirit of the present invention.

The textured surface TS is not required to be located toward the main surface 11a in comparison to the surface of the region 19 in the thickness direction of the semiconductor substrate 11. That is, the textured surface TS is not required to be located toward the main surface 11a in comparison to the virtual plane VP. For example, the top of the textured surface TS may be located at the same position as the virtual plane VP. In a case where the textured surface TS is located toward the main surface 11a in comparison to the virtual plane VP, the semiconductor photodetector 1 reduces generation of the dark currents as described above.

The edge region TSa is not required to be continuous with the surface of the region 19. For example, the edge region TSa may be separated from the step formed by the regions 17 and 19. For example, a region not including the textured surface TS may be located between the edge region TSa and the step formed by the regions 17 and 19. In this case, for example, the entire edge region TSa may be surrounded by the region not including the textured surface TS when viewed in the direction orthogonal to the semiconductor substrate 11. For example, the region 17 may include a region not including the textured surface TS.

The edge region TSa may be approximately parallel to the thickness direction of the semiconductor substrate. In a case where the edge region TSa is inclined to the thickness direction of the semiconductor substrate 11, the semiconductor photodetector 1 further decreases generation of the dark currents as described above.

The bump electrodes 35 may be directly disposed on the pad electrode 31. In this case, the semiconductor photodetector 1 does not include the UBMs 33.

The present description discloses following notes.

(Note 1)

A back-illuminated semiconductor photodetector including
a semiconductor substrate including a first main surface and a second main surface opposing each other, wherein
the semiconductor substrate includes a first semiconductor region of a first conductivity type, and a plurality of second semiconductor regions of a second conductivity type, the second semiconductor regions provided in a side of the second main surface and constituting pn junctions with the first semiconductor region,
each of the plurality of second semiconductor regions includes a first region including a textured surface, and a second region,
a thickness of the first region at a deepest position of recesses of the textured surface is smaller than a distance between a surface of the second region and the deepest position in a thickness direction of the semiconductor substrate,
the first main surface is a light incident surface of the semiconductor substrate.

(Note 2)

The back-illuminated semiconductor photodetector according to Note 1, wherein
a thickness of the second region in the thickness direction of the semiconductor substrate is larger than a thickness of the first region in the thickness direction of the semiconductor substrate.

(Note 3)

The back-illuminated semiconductor photodetector according to Note 2, further including
an electrode disposed in the second region and in contact with the second region.

(Note 4)

The back-illuminated semiconductor photodetector according to any one of Notes 1 to 3, wherein
the textured surface of the first region is located toward the first main surface in comparison to the surface of the second region in the thickness direction of the semiconductor substrate.

(Note 5)

The back-illuminated semiconductor photodetector according to Note 4, wherein
an edge region of the textured surface of the first region is continuous with the surface of the second region, and is inclined to the thickness direction of the semiconductor substrate.

(Note 6)

The back-illuminated semiconductor photodetector according to any one of Notes 1 to 5, wherein
the second region includes no textured surface.

In an embodiment of Note 1, the second region may include a surface where protrusions and recesses are formed. For example, the second region may include the textured surface. For example, the second region may include a surface where protrusions and recesses having a state different from those of the textured surface are formed.

In a case where the second region includes a surface where protrusions and recesses are formed, a position of the surface of the second region may be defined as follows.

The position of the surface of the second region may be a deepest position of the deepest recess in all the recesses. The position of the surface of the second region may be a deepest position of the shallowest recess in all the recesses. The position of the surface of the second region may be a deepest position of any one of all the recesses. The position of the surface of the second region may be an average position of deepest positions of all the recesses.

The position of the surface of the second region may be defined by a highest top of all tops. The position of the surface of the second region may be defined by a lowest top of all the tops. The position of the surface of the second region may be defined by any one of all the tops. The position of the surface of the second region may be an average height position of all the tops.

In a case where the second region includes a surface where protrusions and recesses are formed, the thickness of the second region changes in correspondence with the protrusions and recesses of the surface. In this case, the thickness of the second region may be either a maximum thickness of the second region, or a minimum thickness of the second region. The thickness of the second region may be an average thickness of the second region.

A deepest position of the recesses in the textured surface of the first region and the thickness of the first region may be defined similarly to the embodiments described above.

In the embodiment of Note 1, the second region may have both a surface where protrusions and recesses are formed, and a flat surface. In this case, the position of the surface of the second region may be defined either in the surface where the protrusions and recesses are formed, or in the flat surface. The position of the surface of the second region may be an average height position of the surface where the protrusions and recesses are formed and the flat surface.

The present description also discloses a following note.
(Note 7)
A back-illuminated semiconductor photodetector including
a semiconductor substrate including a first main surface and a second main surface opposing each other, wherein
the semiconductor substrate includes a first semiconductor region of a first conductivity type, and a plurality of second semiconductor regions of a second conductivity type, the second semiconductor regions provided in a side of the second main surface and constituting pn junctions with the first semiconductor region,
each of the plurality of second semiconductor regions includes a textured surface,
a thickness of the second semiconductor region at a deepest position of recesses of the textured surface is smaller than a distance between a top of the textured surface and the deepest position in a thickness direction of the semiconductor substrate,
the first main surface is a light incident surface of the semiconductor substrate.

In an embodiment of Note 7, the deepest position may be defined as follows.

The deepest position may be a deepest position of the deepest recess in all the recesses. The deepest position may be a deepest position of the shallowest recess in all the recesses. The deepest position may be a deepest position of any one of all the recesses. The deepest position may be an average position of deepest positions of all the recesses.

In the embodiment of Note 7, the top of the textured surface may be defined as follows.

The top of the textured surface may be the highest top of all tops. The top of the textured surface may be the lowest top of all the tops. The top of the textured surface may be any one of all the tops. The top of the textured surface may be an average position of all the tops.

In the embodiment of Note 7, the distance between the top of the textured surface and the deepest position in the thickness direction of the semiconductor substrate may be defined as follows.

The distance may be a maximum value of height differences between the protrusions and recesses, or a minimum value of the height differences between the protrusions and recesses. The distance may be a height difference between the protrusions and recesses at any position on the textured surface. The distance may be an average value of the height differences between the protrusions and recesses.

In the embodiment of Note 7, the entire surface of each of the second semiconductor regions may be the textured surface.

INDUSTRIAL AVAILABILITY

The present invention is applicable to a back-illuminated semiconductor photodetector.

REFERENCE SIGNS LIST

1 Back-illuminated semiconductor photodetector
11 Semiconductor substrate
11a, 11b Main surface
13, 15 Semiconductor region
17 Region including textured surface
19 Region including no textured surface
31 Pad electrode
31a, 31b Electrode region
35 Bump electrode
D1 Distance between surface of region including no textured surface, and deepest position of recesses of textured surface
TH1 Thickness at deepest position of recesses of textured surface
TH2 Thickness of region including no textured surface in thickness direction of semiconductor substrate
TH3 Thickness of region including textured surface in thickness direction of semiconductor substrate
TS Textured surface
TSa Edge region of textured surface

The invention claimed is:
1. A back-illuminated semiconductor photodetector comprising
a semiconductor substrate including a first main surface and a second main surface opposing each other, wherein
the semiconductor substrate includes a first semiconductor region of a first conductivity type, and a plurality of second semiconductor regions of a second conductivity type, the second semiconductor regions provided in a side of the second main surface and constituting pn junctions with the first semiconductor region,
each of the plurality of second semiconductor regions includes a first region including a textured surface, and a second region including no textured surface,
a thickness of the first region at a deepest position of recesses of the textured surface is smaller than a distance between a plane including a surface of the second region and the deepest position in a thickness direction of the semiconductor substrate, and is smaller than a distance between the plane and a top of the textured surface in the thickness direction, and
the first main surface is a light incident surface of the semiconductor substrate.

2. The back-illuminated semiconductor photodetector according to claim 1, wherein
a thickness of the second region in the thickness direction of the semiconductor substrate is larger than a thickness of the first region in the thickness direction of the semiconductor substrate.

3. The back-illuminated semiconductor photodetector according to claim 2, further comprising
an electrode disposed on the second region and in contact with the second region.

4. The back-illuminated semiconductor photodetector according to claim 1, wherein
the textured surface of the first region is located toward the first main surface in comparison to the surface of the second region in the thickness direction of the semiconductor substrate.

5. The back-illuminated semiconductor photodetector according to claim 4, wherein
an edge region of the textured surface of the first region is continuous with the surface of the second region, and is inclined to the thickness direction of the semiconductor substrate.

* * * * *